(12) United States Patent
Dieny et al.

(10) Patent No.: US 9,835,696 B2
(45) Date of Patent: Dec. 5, 2017

(54) MAGNETIC FIELD SENSOR FOR THE DETECTION OF AT LEAST TWO MAGNETIC FIELD COMPONENTS INCLUDING FLUX CONCENTRATORS AND MAGNETORESISTIVE ELEMENTS

(71) Applicants: COMMISSARIAT A L'ENERGIE ATOMIQUE ET AUX ENERGIES ALTERNATIVES, Paris (FR); Centre National de la Recherche Scientifique (CNRS), Paris (FR)

(72) Inventors: Bernard Dieny, Villard de Lans (FR); Hélène Joisten, Grenoble (FR); Philippe Sabon, Moirans (FR)

(73) Assignees: COMMISSARIAT À L'ÉNERGIE ATOMIQUE ET AUX ÉNERGIES ALTERNATIVES, Paris (FR); CENTRE NATIONAL DE LA RECHERCHE SCIENTIFIQUE (CNRS), Paris (FR)

( * ) Notice: Subject to any disclaimer, the term of this patent is extended or adjusted under 35 U.S.C. 154(b) by 67 days.

(21) Appl. No.: 14/885,203

(22) Filed: Oct. 16, 2015

(65) Prior Publication Data
US 2016/0109534 A1 Apr. 21, 2016

(30) Foreign Application Priority Data
Oct. 16, 2014 (FR) ...................................... 14 59950

(51) Int. Cl.
*G01R 33/09* (2006.01)
*G01R 33/00* (2006.01)
(Continued)

(52) U.S. Cl.
CPC .......... *G01R 33/09* (2013.01); *G01R 33/0011* (2013.01); *G01R 33/0052* (2013.01); *G01R 33/02* (2013.01); *G01R 35/005* (2013.01)

(58) Field of Classification Search
CPC .. G01R 33/0052; G01R 33/09; G01R 35/005; G01R 33/0011; G01R 33/02
(Continued)

(56) References Cited

U.S. PATENT DOCUMENTS 5,592,082 A * 1/1997 Kuriyama .............. G01R 33/09
324/252
5,644,228 A * 7/1997 Jeffers .................... G01R 33/09
235/449

(Continued)

OTHER PUBLICATIONS

French Search Report as issued in French Patent Application No. 1459950, dated Aug. 7, 2015.
(Continued)

*Primary Examiner* — Jay Patidar
(74) *Attorney, Agent, or Firm* — Pillsbury Winthrop Shaw Pittman LLP

(57) ABSTRACT

A magnetic field sensor includes first and second sensors for detecting first and second magnetic components according to first and second directions. Each sensor includes a flux concentrator including first and second magnetic parts, an air gap between the parts, and a magnetoresistive element in the air gap. Each magnetoresistive element includes a reference layer having a fixed magnetization direction, the fixed magnetization direction of the first and second sensors being substantially identical, and a sensitive layer having a variable magnetization direction, the variable magnetization direction of the first sensor when the first sensor is in a state of rest being substantially identical to the variable magnetization direction of the second sensor when the second sensor is in the state of rest. The air gaps of first and second
(Continued)

sensor are oriented parallel to a direction XY which is, at ±15°, the bisector of the first and second directions.

14 Claims, 11 Drawing Sheets

(51) Int. Cl.
    *G01R 33/02*         (2006.01)
    *G01R 35/00*         (2006.01)

(58) Field of Classification Search
    USPC .......................... 324/207.21, 252, 244, 260
    See application file for complete search history.

(56) References Cited

U.S. PATENT DOCUMENTS

| | | | |
|---|---|---|---|
| 5,712,565 A * | 1/1998 | Schultz | G01R 33/09 324/252 |
| 2009/0309580 A1* | 12/2009 | Dmytriw | G01R 33/09 324/207.21 |
| 2011/0309829 A1 | 12/2011 | Loreit et al. | |
| 2014/0021571 A1 | 1/2014 | Lei et al. | |
| 2014/0266179 A1* | 9/2014 | Ausserlechner | G01D 5/145 324/244 |

OTHER PUBLICATIONS

Sileo, L., et al., "Fully integrated three-axis Hall magnetic sensor based on micromachined structures," Microelectronic Engineering 87 (2010), pp. 1217-1219.

* cited by examiner

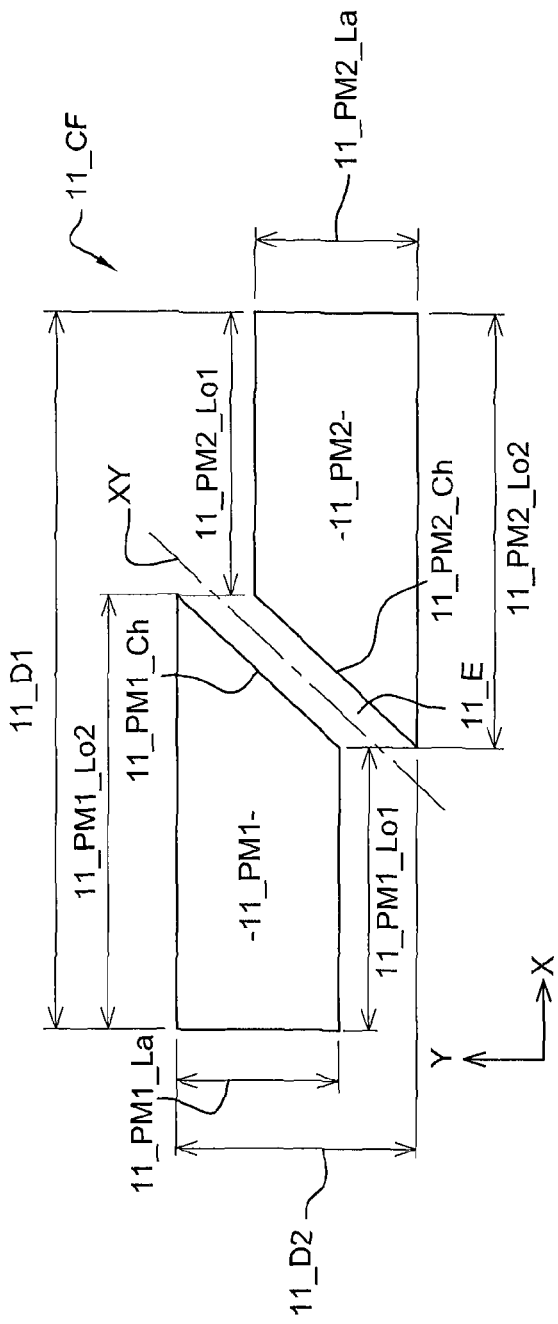
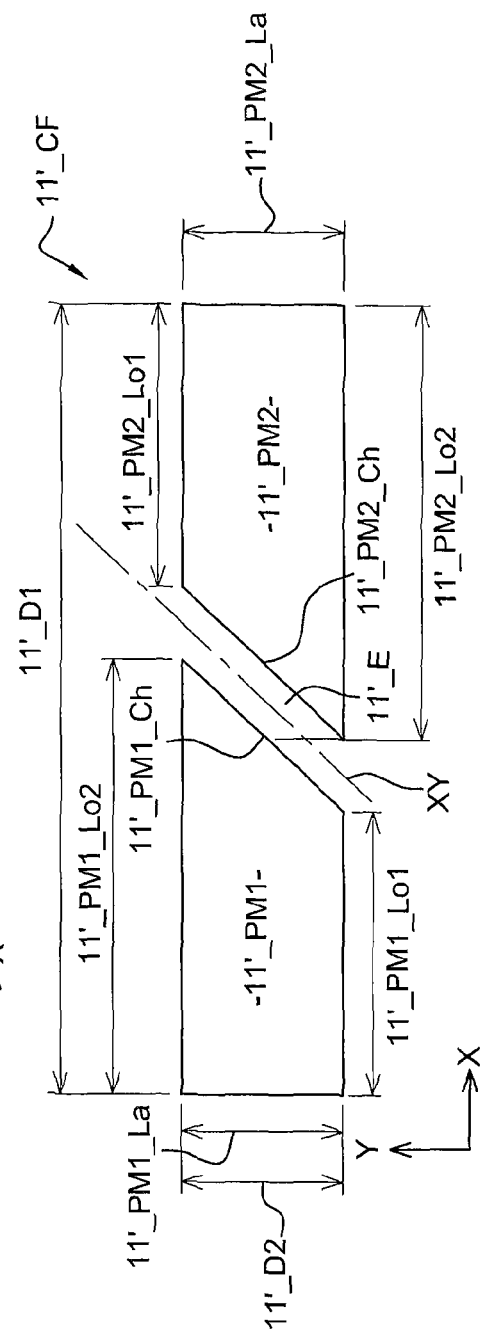
Fig. 4a
Fig. 4b

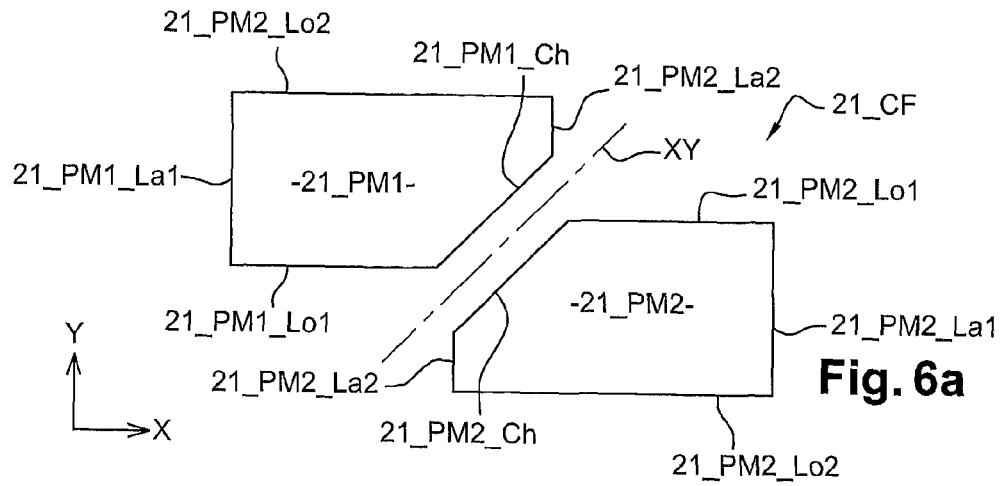
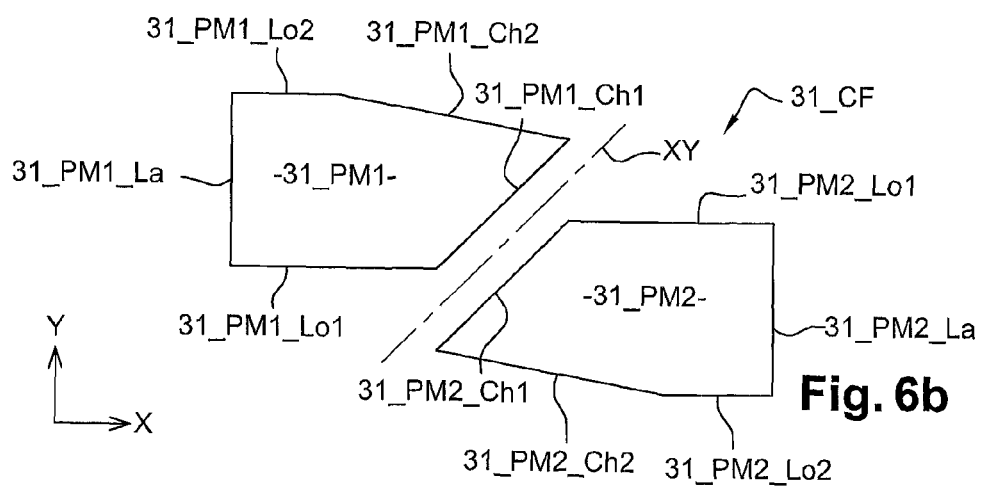
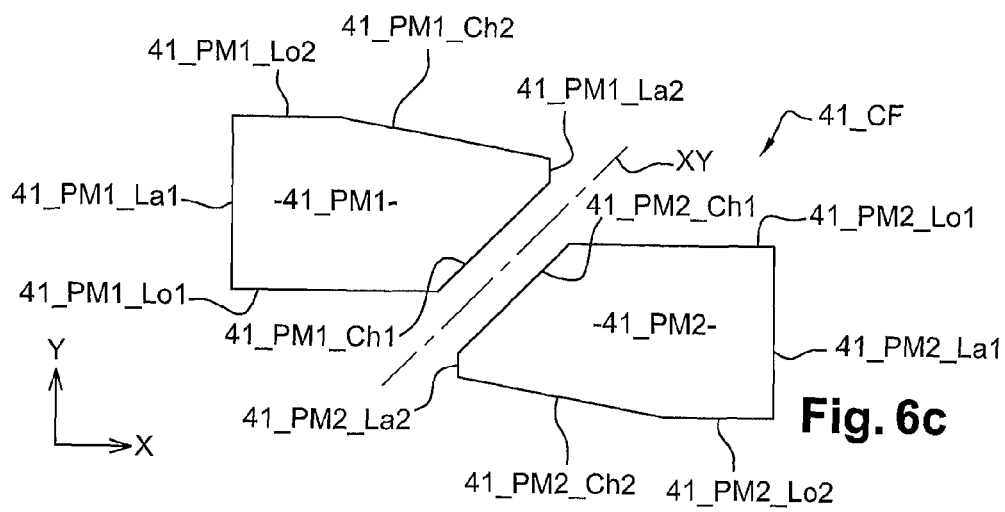

MAGNETIC FIELD SENSOR FOR THE DETECTION OF AT LEAST TWO MAGNETIC FIELD COMPONENTS INCLUDING FLUX CONCENTRATORS AND MAGNETORESISTIVE ELEMENTS

CROSS-REFERENCE TO RELATED APPLICATIONS

This application claims priority to French Patent Application No. 1459950, filed Oct. 16, 2014, the entire content of which is incorporated herein by reference in its entirety.

FIELD

The technical field of the invention is that of magnetic field sensors.

BACKGROUND

Two-dimensional (2D) or three-dimensional (3D) magnetic field sensors give rise to a strong interest for vast fields of application such as the automobile, avionics or space industry, mobile or on-board systems, mobile telephony, the field of personal computers, petrochemistry, the environment or biomedical, etc. New solutions are sought in order to obtain 2D or 3D magnetic field sensors with the following properties:

high sensitivity according to each dimension,
low energy consumption,
low weight, high degree of lightness,
miniaturisation for minimum encumbrance,
facility for collective manufacturing for mass production at relatively low costs,
easy to use.

Indeed, the existing 2D or 3D magnetic field sensors have limitations concerning their performance or their manufacturing techniques.

A 2D or 3D magnetic field sensor allows for the directional measurement of the magnetic field B by the measurement, simultaneously and without having to reorient the sensor in space, of two or three components of the magnetic field B. A 3D magnetic field sensor makes it possible as such, by the simultaneous measurement of three components (Bx, By, Bz) of the magnetic field B in space, to carry out a mapping of the magnetic field vector in the region explored, i.e. in a given field range: this can be a mapping of the variations of the magnetic field vector in space, or a mapping of the variations of the magnetic field vector over time, possibly at high frequency. It is typically desired that a 2D or 3D magnetic field sensor have the same measurement sensitivity over its various dimensions and be as sensitive, over each one of its dimensions, as a uniaxial magnetic field sensor. The existing uniaxial magnetic field sensors are for example sensors with giant magnetoresistance GMR, sensors with anisotropic magnetoresistance AMR, sensors with tunnel magnetoresistance TMR or microfluxgate sensors. Such sensors are sometimes called "vector sensors" as they measure a vector component of the magnetic field applied.

According to the cases, the ambient magnetic fields to be measured can come from local sources of currents or from magnetic materials such as magnets. It can also concern measuring the terrestrial or spatial magnetic field, or measuring fields created by living organisms. Generally, the magnetic fields to be measured typically have weak amplitudes and/or weak variations that are desired to be detected. The desired measurement ranges can be highly varied. A strong field to be measured can sometimes be higher than Tesla T. More commonly, the fields to be measured are of a magnitude of the millitesla mT, of the microtesla μT (as such the local terrestrial field is of a magnitude of 50 μT environ) or of the nanotesla nT. The fields to be measured can also be of a magnitude of the picotesla pT or of the femtotesla fT, etc. An objective can for example be to measure in three dimensions weak variations in the terrestrial field, for example of the magnitude of the nT, or very weak values of the magnetic field in space. Certain fields such as space, geomagnetometry or biomagnetometry in particular require magnetic field sensors that have high performance in terms of sensitivity.

Uniaxial magnetic sensors, or monoaxial magnetic sensors, such as GMR sensors, are known for measuring the amplitude of the magnetic field on the axis of the sensor. Uniaxial magnetic sensors are typically carried out on the surface of a substrate by microelectronic techniques.

FIG. 1 shows by way of example a uniaxial sensor GMR 1 according to prior art. Such a uniaxial sensor GMR is also called a "spin valve".

The uniaxial sensor GMR 1 comprises a flux concentrator CF that comprises a first magnetic part PM1 and a second magnetic part PM2. The first magnetic part PM1 and the second magnetic part PM2 are separated by an air gap E. In the example of FIG. 1, the flux concentrator F has a dimension L1, referred to as "large dimension", according to an X axis and a dimension L2, referred to as "small dimension", according to a Y axis. The Y axis is perpendicular to the X axis. The flux concentrator F makes it possible to capture the magnetic flux that is created by the field B to be measured in the direction X of its large dimension L1, and to amplify this field B to be measured on a magnetoresistive element MR. The magnetoresistive element MR is typically inserted into the air gap E of the flux concentrator F. The first and second magnetic parts PM1 and PM2 of the flux concentrator F are made from a soft material, which is typically permalloy.

The magnetoresistive element MR of the uniaxial sensor GMR 1 makes it possible to transform a variation in the magnetic field into a variation of electrical resistance, which is measured thanks to two electrical contacts ct1 and ct2. In the case of the uniaxial sensor GMR 1, the magnetoresistive element MR is a spin valve that uses the phenomenon of giant magnetoresistance. Alternatively, other types of uniaxial sensors can use a magnetoresistive element which is a magnetic tunnel junction. A spin valve is in particular constituted of a magnetic layer of which the magnetisation direction Mref is trapped, called "reference layer", and of a magnetic layer of which the magnetisation direction Mvar is variable, called "soft layer". The magnetisation direction Mvar of the soft layer easily turns under the influence of a field B to be measured. The reference layer and the soft layer are separated by a non-magnetic layer which is typically made of copper. The trapping of the reference layer is in general carried out by interaction with an antiferromagnetic layer adjacent to the reference layer, by an anisotropic exchange mechanism. The antiferromagnetic layer is not shown in FIG. 1. Alternatively, the reference layer can be a synthetic antiferromagnetic layer comprising two ferromagnetic layers coupled in an antiparallel manner through a fine layer of antiparallel coupling often made of ruthenium with a thickness less than 1 nm. This synthetic antiferromagnetic layer can itself be trapped by interaction with another antiferromagnetic layer. In the example of FIG. 1, the magnetisation direction Mref of the reference layer is parallel to the field B to be measured, i.e. parallel to the X axis, and in a zero field, the magnetisation direction Mvar of the soft layer is transverse to the field B to be measured, i.e. parallel to the Y axis. In the case of the uniaxial sensor GMR 1 using a spin valve, the electrical contacts ct1 and ct2 are arranged on either side of the magnetoresistive element MR, i.e. on either side of the spin valve, in such a way that an electric current can flow in the plane of the layers: this is a known CIP ("Current In Plane") configuration. In the alternative case of a uniaxial sensor that uses a magnetic tunnel junction, the electrical contacts ct1 and ct2 are taken one under the stack of the layers and the other on the stack of the layers in such a way that an electric current can pass through the magnetic tunnel junction perpendicularly to the tunnel barrier.

The magnetic field radiated in the air gap E that separates the two magnetic parts of the flux concentrator F is very weak when the field applied is zero. On the other hand, when the field is applied according to the large dimension L1 of the flux concentrator CF, the soft material of the magnetic parts PM1 and PM2 is polarised magnetically parallel to the field and creates a strong field radiated in the air gap E of the flux concentrator CF wherein is arranged the magnetoresistive element MR. Under the effect of the field B to be measured, the magnetisation direction Mvar of the soft layer of the magnetoresistive element MR turns and approaches either the parallel alignment, or the antiparallel alignment in relation to the magnetisation direction Mref of the reference layer. When the magnetoresistive element MR is passed through by an electric current, this results in a voltage at the terminals of the magnetoresistive element MR which varies according to the field B applied on the magnetoresistive element MR. In the case of the uniaxial sensor GMR 1, the resistance of the spin valve varies as the cosine of the angle between the magnetisation direction Mref of the reference layer and the magnetisation direction Mvar of the soft layer. In the alternative case of a uniaxial sensor that uses a magnetic tunnel junction, this is the conductance of the magnetic tunnel junction that varies as the cosine of the angle between the magnetisation direction Mref of the reference layer and the magnetisation direction Mvar of the soft layer.

Still in the case of a uniaxial measurement, as the measurement direction is defined by the large dimension L1 of the flux concentrator, a first permanent magnet A1 and a second permanent magnet A2 are arranged on either side of the magnetoresistive element MR. The first and second permanent magnets A1 and A2 are typically made from a hard magnetic material and create a field Hbias that polarises the magnetisation direction Mvar of the soft layer transversally to the direction of the field to be measured. It is as such ensured that the magnetisation direction Mvar of the soft layer in zero field is single-domain and polarised transversally to the direction of the field to be measured. The transverse field Hbias is not excessively large in order to not excessively reduce the sensitivity of the sensor. At the ends of the magnetoresistive element MR in contact with each permanent magnet, the transverse field Hbias is typically of a magnitude of 0.1 to 1 times the maximum value of the field that is sought to be measured. The transverse field Hbias is lower at the centre of the magnetoresistive element MR than at its ends, due to a greater separation with respect to the permanent magnets. The transverse field Hbias makes it possible to substantially reduce the noise of the sensor by preventing the formation of complex magnetic structures in the sensitive layer.

A 2D magnetic field sensor can typically be obtained by placing on the surface of a substrate a first uniaxial sensor that has a first measurement axis and a second uniaxial sensor having a second measurement axis, with the second measurement axis forming a non-zero angle, generally 90°, with the first measurement axis. Such a realisation with two different orientations of magnetic sensors is obtained by microelectronic methods. However, manufacturing a 2D magnetic field sensor of the GMR or TMR type by association of two monoaxial sensors orthogonal to the surface of a substrate imposes in the state of the art a certain technological complexity.

FIG. 2 shows by way of example a 2D magnetic field sensor according to prior art, comprising a first uniaxial sensor 1-$x$ of measurement axis X and a second uniaxial sensor 1-$y$ of measurement axis Y. The first sensor 1-$x$ of measurement axis X makes it possible to measure a first component B-$x$ of a magnetic field applied and the second sensor 1-$y$ of measurement axis Y makes it possible to measure a second component B-$y$ of the magnetic field applied. In a manner similar to what has been described hereinabove, the first sensor 1-$x$ comprises;

a flux concentrator CF-$x$ comprising a first magnetic part PM1-$x$, a second magnetic part PM2-$x$ and an air gap E-$x$ that separates the first and second magnetic parts;

a magnetoresistive element MR-$x$ comprising a reference layer of which the magnetisation direction Mref-$x$ is fixed according to the X axis and a soft layer of which the magnetisation direction Mvar-$x$ is variable;

a first permanent magnet A1-$x$ and a second permanent magnet A2-$x$ that create a transverse field Hbias-$x$ that polarises the magnetisation direction Mvar-$x$ of the soft layer transversally to the magnetisation direction Mref-$x$ of the reference layer, i.e. according to the Y axis;

a first electrical contact ct1-$x$ and a second electrical contact ct2-$x$.

The second sensor 1-$y$ comprises:

flux concentrator CF-$y$ comprising a first magnetic part PM1-$y$, a second magnetic part PM2-$y$ and an air gap E-$y$ that separates the first and second magnetic parts;

a magnetoresistive element MR-$y$ comprising a reference layer of which the magnetisation direction Mref-$y$ is fixed according to the Y axis and a soft layer of which the magnetisation direction Mvar-$y$ is variable;

a first permanent magnet A1-$y$ and a second permanent magnet A2-$y$ that create a transverse field Hbias-$y$ that polarises the magnetisation direction Mvar-$y$ of the soft layer transversally to the magnetisation direction Mref-$y$ of the reference layer, i.e. according to the X axis;

a first electrical contact ct1-$y$ and a second electrical contact ct2-$y$.

The fact that the measurement axis of the magnetoresistive element MR-$x$ of the first sensor 1-$x$ forms an angle, typically 90°, with the measurement axis of the magnetoresistive element MR-$y$ of the second sensor 1-$y$ imposes to trap in a different manner the magnetisation direction Mref-$x$ of the reference layer of the first sensor 1-$x$ on the one hand, and the magnetisation direction Mref-$y$ of the reference layer of the second sensor 1-$y$ on the other hand. This also imposes to polarise differently the magnetisation direction Mvar-$x$ of the soft layer of the first sensor 1-$x$ on the one hand, and the magnetisation direction Mvar-$y$ of the soft layer of the second sensor 1-$y$ on the other hand. In the example of FIG. 2, this therefore relates to trapping the magnetisation direction Mref-$x$ of the reference layer of the first sensor 1-x according to the X axis, and to trapping the magnetisation direction Mref-y of the reference layer of the second sensor 1-y according to the Y axis. Still in the example of FIG. 2, this entails polarising the magnetisation direction Mvar-x of the soft layer of the first sensor 1-x according to the Y axis, and polarising the magnetisation direction Mvar-y of the soft layer of the second sensor 1-y according to the X axis.

However this double constraint—trapping differently the magnetisation directions of the reference layers and polarising differently the magnetisation directions of the soft layers—substantially increases the complexity the technology of modifying such a 2D magnetic field sensor.

Indeed, the trapping of the magnetisation direction of a reference layer of a spin valve is carried out typically via an annealing and a cooling under the field of the spin valve from the blocking temperature of the antiferromagnetic trapping layer of the reference layer, Orienting the magnetisation directions of a first reference layer and of a second reference layer according to two different directions therefore requires that the blocking temperature of the antiferromagnetic trapping layer of the first reference layer be different from the blocking temperature of the antiferromagnetic trapping layer of the second reference layer. The first reference layer can for example have an IrMn antiferromagnetic layer, while the second reference layer has a PtMn antiferromagnetic layer. But this implies that the two uniaxial sensors of the 2D magnetic field sensor cannot be manufactured in a single technological step, and must on the contrary be manufactured in technologically different steps. The manufacturing is therefore rendered more complex and the manufacturing costs are increased. Another possibility is to apply different local fields on the two uniaxial sensors during the annealing. This cannot be done with macroscopic magnets and typically requires the adding of an elbowed conductor line passing over the two uniaxial sensors and wherein a current is made to flow during the annealing and the cooling. This current generates a field in two orthogonal directions if the line has an elbow that is suitably arranged in relation to the position of the two uniaxial sensors. However, the carrying out of this elbowed conductor line also renders the manufacturing technology more complex.

Moreover, the permanent magnets used to polarise the magnetisation directions of the soft layers are made of hard magnetic materials, of the alloy type with a base of Co and of Cr, or of Sm and of Co, or of NdFeB in thin layers. The orientation of the magnetisation directions of these permanent magnets is carried out by applying a strong magnetic field, i.e. above the coercive field of the material, which induces a remanent magnetisation in the desired direction. This strong magnetic field should however be applied over the entire wafer, in that there is no simple solution for applying such a strong magnetic field on a local scale. In this case, the magnetisation directions of the permanent magnets are parallel, which is not satisfactory. Alternatively, certain magnetic field sensors do not use permanent magnets and use non-polarised soft layers, or polarised soft layers by weakly coupling their magnetisation direction with an antiferromagnetic layer. In this case, the reference layer and the soft layer are both coupled to an antiferromagnetic layer: the reference layer is strongly coupled to a first antiferromagnetic layer in order to block its magnetisation direction, while the soft layer is weakly coupled to a second antiferromagnetic layer, in such a way that the second antiferromagnetic layer exerts a weak polarisation field on the magnetisation direction of the soft layer, but that the magnetisation direction of the soft layer remains variable and can still turn under the effect of a magnetic field applied. In this configuration, for a given uniaxial sensor, in order to orient the magnetisation direction of the reference layer orthogonally to the direction of polarisation of the soft layer, a first antiferromagnetic layer is used, having a blocking temperature that is different from the blocking temperature of the second antiferromagnetic layer. The antiferromagnetic layer that has the highest blocking temperature is oriented first, then the field applied is turned 90° before orienting the antiferromagnetic layer that has the lowest blocking temperature. However, there is no simple solution afterwards for initialising the two uniaxial sensors in relation to one another.

The difficulties linked to manufacturing a 2D magnetic field sensor, allowing for the measurement of a first magnetic field component Bx and of a second magnetic field component By in the plane of a substrate, have been described hereinabove. If it is now sought to manufacture a 3D magnetic field sensor, new difficulties arise. Indeed, the measurement of a third magnetic field component Bz outside the plane of the substrate is much more complex to obtain simultaneously and with the same precision as the first and second magnetic field components Bx and By in the plane of the substrate. In order to measure the third component with the same sensitivity as the first and second components, this entails using a third uniaxial sensor outside of the surface of the substrate, the third uniaxial sensor being of the same type as the first and second uniaxial sensors on the surface of the substrate. The third uniaxial sensor is perpendicular to the surface of the substrate. But from a technological standpoint, there is no simple solution that makes it possible to obtain such a third uniaxial sensor having a high sensitivity with respect to the third magnetic field component Bz. In general, the third uniaxial sensor is carried out on a plane that is inclined in relation to the plane of the substrate, or is carried out separately then fixed perpendicularly to the plane of the first and second uniaxial sensors. In both cases, the method of manufacture of the 3D magnetic field sensor is rendered complex.

SUMMARY

An aspect of this invention relates to a magnetic field sensor for the detection of at least two magnetic field components. Another aspect of the invention relates to a magnetic field sensor for the detection of at least three magnetic field components. Another aspect of the invention relates to a method for manufacturing a magnetic field sensor for the detection of at least three magnetic field components.

In this context, an aspect of the invention offers a solution to the problems mentioned hereinabove by proposing a magnetic field sensor for the detection of at least two magnetic field components that can be obtained by a simple and inexpensive method of manufacture, with the reference layers having the same magnetisation direction obtained in a single technological step.

An aspect of the invention therefore relates to a magnetic field sensor for the detection of at least two magnetic field components comprising:
  a first sensor for the detection of a first magnetic component according to a first direction X comprising:
    a first flux concentrator comprising a first magnetic part, a second magnetic part and an air gap between the first and second magnetic parts;
    a first magnetoresistive element arranged in the air gap of the first flux concentrator, a second sensor for the detection of a second magnetic component according to a second direction Y that is different from the first direction X comprising:
  a second flux concentrator comprising a first magnetic part, a second magnetic part and an air gap between the first and second magnetic parts;
  a second magnetoresistive element arranged in the air gap of the second flux concentrator;
each one of the first and second magnetoresistive elements comprising a reference layer having a fixed magnetisation direction and a sensitive layer having a variable magnetisation direction, with each of the first and second magnetoresistive elements having a first state referred to as "state of rest" wherein the magnetisation of the sensitive layer has a given first direction, and a second state referred to as "excited state" wherein the magnetisation of the sensitive layer has a second direction that is different from the first direction;
the magnetic field sensor being such that:
  the fixed magnetisation direction of the reference layer of the first magnetoresistive element is substantially identical to the fixed magnetisation direction of the reference layer of the second magnetoresistive element;
  when the first and second magnetoresistive elements are in the first state of rest, the variable magnetisation direction of the sensitive layer of the first magnetoresistive element is substantially identical to the variable magnetisation direction of the sensitive layer of the second magnetoresistive element;
  the air gap of the first flux concentrator and the air gap of the second flux concentrator are oriented parallel to a direction XY which is, at ±15°, and in an embodiment at ±5°, the bisector of the first direction X and of the second direction Y.

Thanks to the invention, the first magnetoresistive element and the second magnetoresistive element have the same spatial orientation in the plane defined by the first and second directions X and Y; the first magnetoresistive element and the second magnetoresistive element are both oriented substantially parallel to the direction XY. The second magnetoresistive element is simply translated in relation to the first magnetoresistive element 11_MR. The fixed magnetisation direction of the reference layer of the first magnetoresistive element and the fixed magnetisation direction of the reference layer of the second magnetoresistive element can as such be defined during the same single technological step.

In addition to the characteristics that have just been mentioned in the preceding paragraph, the magnetic field sensor for the detection of at least two magnetic field components according to an aspect of the invention can have one or several additional characteristics among the following, considered individually or according to all of the technically permissible combinations:
  The second direction Y is substantially perpendicular to the first direction X.
  The first magnetoresistive element comprises a first antiferromagnetic layer for the trapping of the fixed magnetisation direction of the reference layer of the first magnetoresistive element; the second magnetoresistive element comprises a second antiferromagnetic layer for the trapping of the fixed magnetisation direction of the reference layer of the second magnetoresistive element; and the first antiferromagnetic layer and the second antiferromagnetic layer have the same blocking temperature.
  The first sensor comprises a first permanent magnet and a second permanent magnet arranged on either side of the first magnetoresistive element, the first and second permanent magnets having a same magnetisation direction polarising the magnetisation of the sensitive layer of the first magnetoresistive element and determining the first magnetisation direction of the sensitive layer when the first magnetoresistive element is at rest, and the second sensor comprises a first permanent magnet and a second permanent magnet arranged on either side of the second magnetoresistive element, the first and second permanent magnets having a same magnetisation direction polarising the magnetisation of the sensitive layer of the second magnetoresistive element and determining the first magnetisation direction of the sensitive layer when the second magnetoresistive element is at rest, the magnetisation direction of the first and second permanent magnets of the first sensor being substantially identical to the magnetisation direction of the first and second permanent magnets of the second sensor.
  In addition to the definition of the fixed magnetisation direction of the reference layer of the first magnetoresistive element and of the fixed magnetisation direction of the reference layer of the second magnetoresistive element during the same single technological step, the invention then makes it possible to define the polarisations of the magnetisation directions of the soft layers in the same single second technological step.
  Each one of the first and second flux concentrators has a first dimension, referred to as "large dimension", and a second dimension, referred to as "small dimension", less than the first dimension; the large dimension of the first flux concentrator is according to the first direction X and the small dimension of the first flux concentrator is according to the second direction Y; the large dimension of the second flux concentrator is according to the second direction Y and the small dimension of the second flux concentrator is according to the first direction X.
  The first and second sensors have their magnetoresistive element constituted of the same materials.
  Each magnetic part of each flux concentrator has a chamfered side.
  The chamfered side of each magnetic part of each flux concentrator is a bevelled side.
  Each magnetic part of each flux concentrator has the chamfered side and a second chamfered side.
  The second chamfered side is a second bevelled side.

Another aspect of the invention relates to a magnetic field sensor for the detection of at least three magnetic field components comprising:
  the magnetic field sensor for the detection of at least two magnetic field components according to an aspect of the invention, and
  a third sensor for the detection of a third magnetic component according to a third direction Z that is different from the first direction X and from the second direction Y comprising:
    a third flux concentrator comprising a first magnetic part, a second magnetic part and an air gap between the first and second magnetic parts;
    a third magnetoresistive element arranged in the air gap of the third flux concentrator;
the third flux concentrator having a first dimension referred to as "large dimension" according to a direction substantially parallel to the third direction Z, and a second dimension referred to as "small dimension" according to a direction substantially parallel to the direction XY of the first and second sensors.

In an embodiment, the magnetoresistive elements of the first, second and third sensors are constituted of the same materials with directions of their reference layer and of their sensitive layer at rest that are substantially identical.

An aspect of the invention also relates to a method for manufacturing a magnetic field sensor for the detection of at least three magnetic field components according to an aspect of the invention comprising the following steps:
- a step of carrying out the first sensor on a face of a first region of a substrate, of carrying out the second sensor on a face of a second region of the substrate and of carrying out the third sensor on a face of a third region of the substrate, the substrate extending according to a reference plane OXY, the first direction X and the second direction Y being parallel to the reference plane OXY;
- a step according to which a first portion of the third region of the substrate is separated from the rest of the substrate, the first portion comprising the face whereon the third sensor is carried out and the first portion protruding from the reference plane OXY.

In addition to the characteristics that have just been mentioned in the preceding paragraph, the method of manufacture of a magnetic field sensor for the detection of at least three magnetic field components according to an aspect of the invention can have one or several additional characteristics among the following, considered individually or according to all of the technically permissible combinations:
- The first portion of the third region of the substrate that protrudes from the reference plane OXY extends substantially according to a plane perpendicular to the reference plane OXY.
- The first portion of the third region of the substrate is separated from the rest of the substrate by a step of etching of a second portion and of a third portion of the third region of the substrate.

An aspect of the invention also relates to a method of writing of the magnetisation direction of the reference layers in a magnetic field sensor for the detection of at least two magnetic field components or in a magnetic field sensor for the detection of at least three magnetic field components, wherein the fixed magnetisation direction of the reference layer of each magnetoresistive element is trapped by an antiferromagnetic layer, each antiferromagnetic trapping layer having the same blocking temperature, with the method comprising the following steps:
- simultaneous heating of the antiferromagnetic trapping layers to a temperature greater than the blocking temperature;
- when the antiferromagnetic trapping layers have a temperature greater than the blocking temperature, simultaneous application to the antiferromagnetic trapping layers of a write field oriented according to a desired direction for the magnetisation of the reference layers;
- stoppage of the heating while still maintaining the application of the write field in the antiferromagnetic trapping layers;
- when the antiferromagnetic trapping layers have dropped to a temperature less than the blocking temperature, stopping of the application of the write field.

The invention and its various applications shall be better understood when reading the following description and when examining the accompanying figures.

BRIEF DESCRIPTION OF THE FIGURES

Figures are presented for the purposes of information and in no way limit the invention.

FIG. 4a diagrammatically shows a first configuration of a flux concentrator of a sensor for the detection of a magnetic field component according to a first direction.

FIG. 4b diagrammatically shows a second alternative configuration of a flux concentrator of a sensor for the detection of a magnetic field component according to the first direction.

FIG. 6a diagrammatically shows a second possible geometry for each magnetic part of each flux concentrator.

FIG. 6b diagrammatically shows a third possible geometry for each magnetic part of each flux concentrator according to an embodiment of the invention.

FIG. 6c diagrammatically shows a fourth possible geometry for each magnetic part of each flux concentrator according to an embodiment of the invention.

DETAILED DESCRIPTION

Unless mentioned otherwise, the same element appearing in different figures has a single reference.

Figure 1:
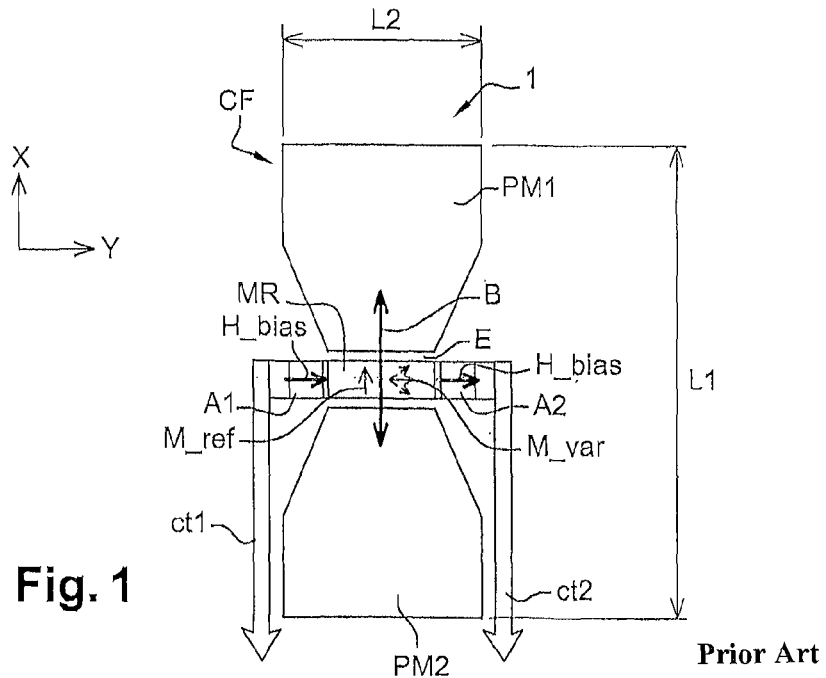
FIG. 1 shows a diagrammatical representation of a uniaxial sensor according to prior art.
Figure 2:
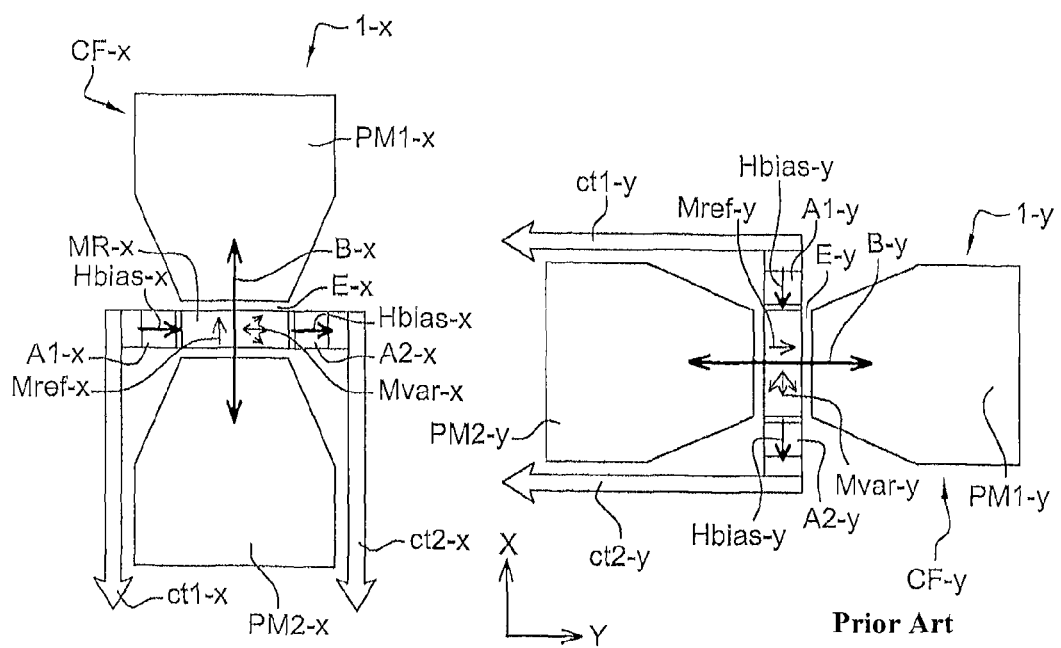
FIG. 2 shows a diagrammatical representation of a magnetic field sensor for the detection of at least two magnetic field components according to prior art.

FIGS. 1 and 2 have been described hereinabove.

Note that in the following description, the air gap of the first flux concentrator and the air gap of the second flux concentrator are oriented parallel to a direction XY which is the bisector of the first direction X and of the second direction Y with the understanding that the invention also applies to directions that separate by ±15° from the bisector. Beyond this, the dissymmetry of the measurements will be excessively detrimental to the sensitivity of the device.

Figure 3A:
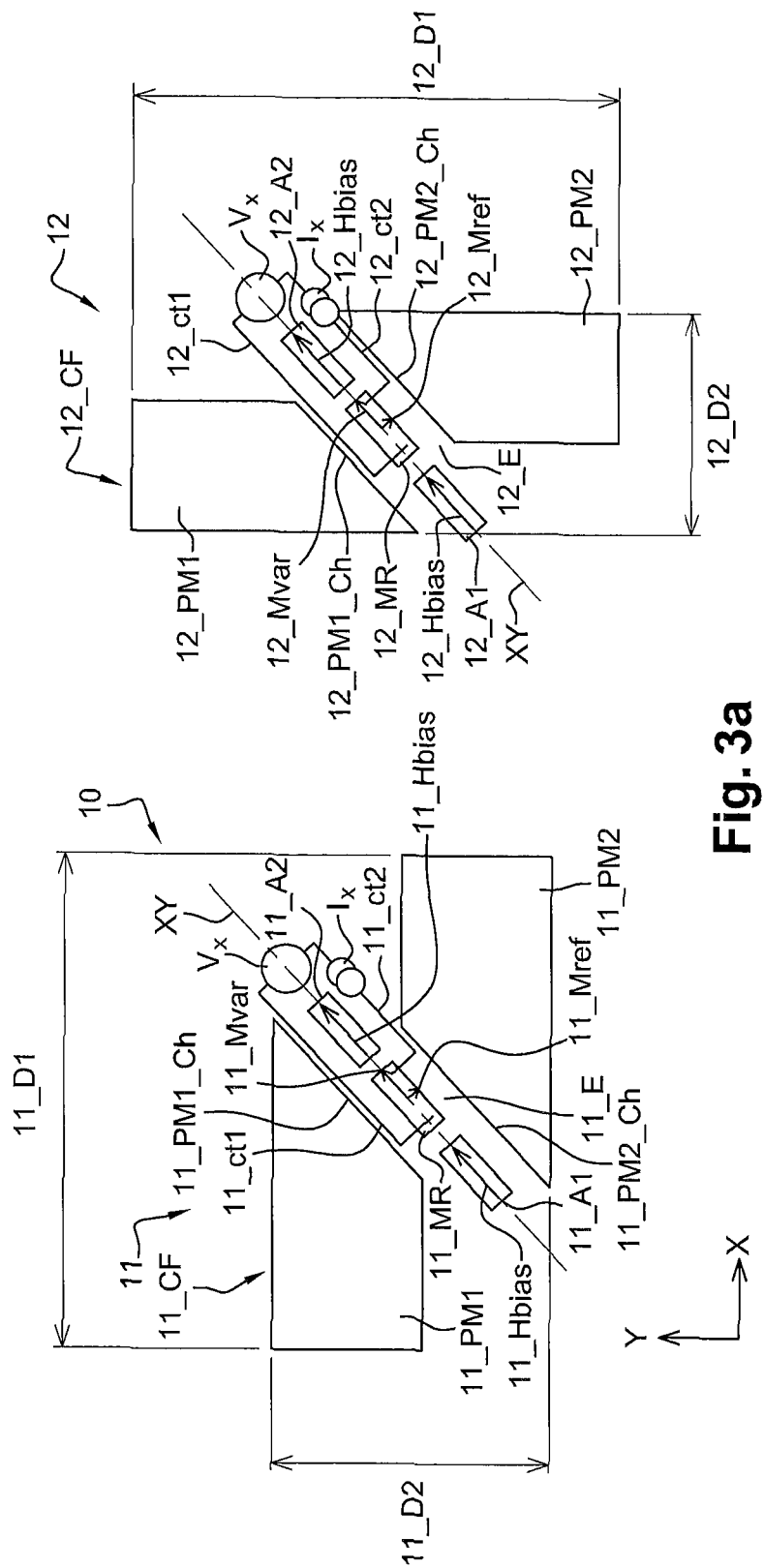
FIG. 3a shows a diagrammatical representation of a magnetic field sensor for the detection of at least two magnetic field components according to an aspect of the invention, in a first state referred to as "rest".

FIG. 3a shows a diagrammatical representation of a magnetic field sensor 10 for the detection of at least two magnetic field components according to a first embodiment of the invention, in a first state referred to as "rest". In the state of rest, no magnetic field to be measured is applied to the magnetic field sensor 10.

The magnetic field sensor 10 comprises:
a first sensor 11 for the detection of a first magnetic field component according to a first X axis;
a second sensor 12 for the detection of a second magnetic field component according to a second Y axis.

The first and second sensors 11 and 12 are typically GMR sensors with giant magnetoresistance, also called "spin valves". A spin valve typically has a magnetoresistance of a magnitude of 5 to 20%. Alternatively, the first and second sensors 11 and 12 can be TMR sensors with a magnetic tunnel junction, in an embodiment with a MgO base for the tunnel barrier. A magnetic tunnel junction typically has a higher magnetoresistance than a spin valve, of a magnitude of 100 to 250%. According to another alternative, the first and second sensors 11 and 12 can be AMR sensors with anisotropic magnetoresistance. The sensitivity of AMR sensors is less in relation to that of GMR or TMR sensors.

The first X axis is different from the second Y axis. The first X axis is substantially perpendicular to the second Y axis. "Substantially perpendicular" refers to the fact that the first X axis forms with the second Y axis an angle between 85° and 95°, and in an embodiment equal to 90°. The first X axis and the second Y axis define a reference plane. The first sensor 11 and the second sensor 12 are typically arranged on the surface of a substrate extending according to the reference plane.

The first sensor 11 comprises:
a first flux concentrator 11_CF, comprising a first magnetic part 11_PM1, a second magnetic part 11_PM2 and an air gap 11_E between the first and second magnetic parts;
a first magnetoresistive element 11_MR arranged in the air gap 11_E of the first flux concentrator 11_CF;
a first electrical contact 11_ct1 and a second electrical contact 11_ct2;
a first permanent magnet 11_A1 and a second permanent magnet 11_A2 arranged on either side of the first magnetoresistive element 11_MR.

Figure 3B:
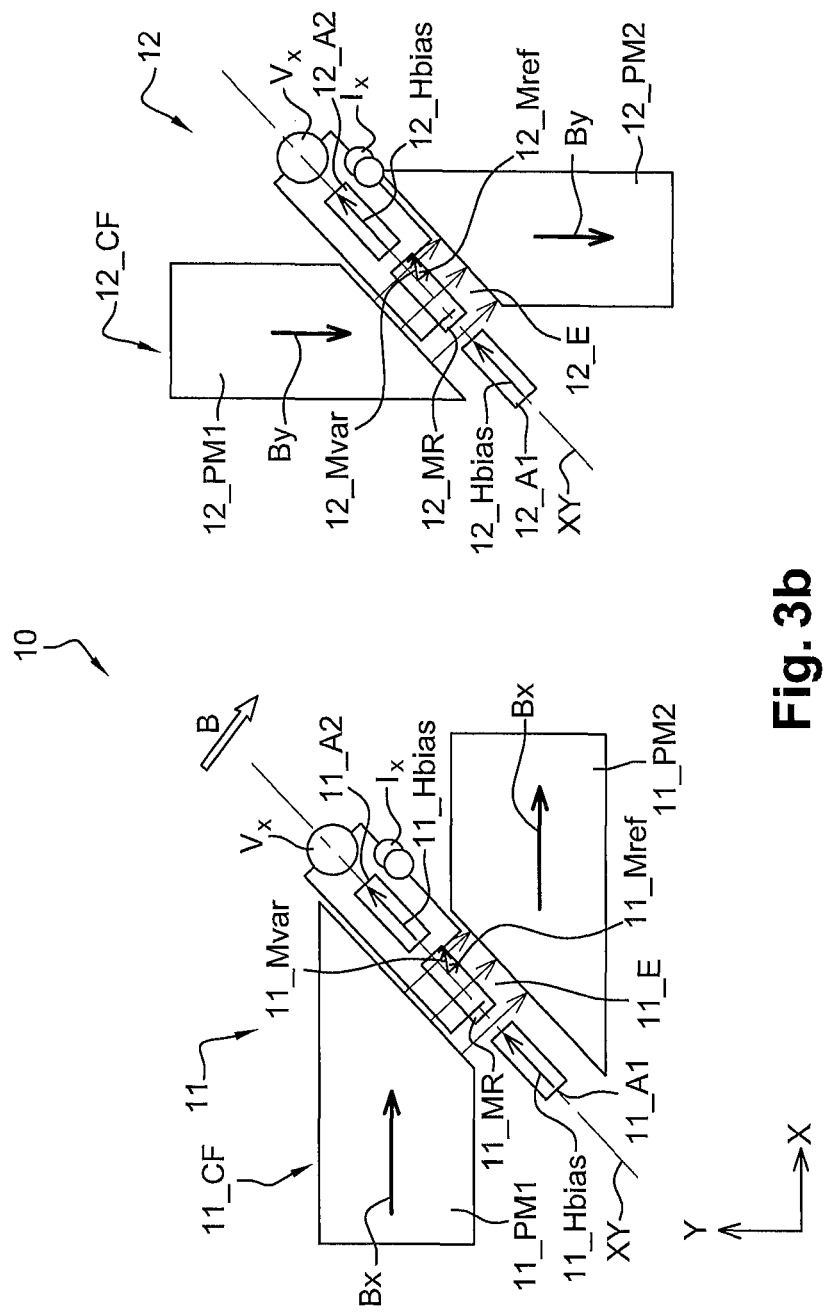
FIG. 3b shows a diagrammatical representation of the magnetic field sensor for the detection of at least two magnetic field components of the FIG. 3a, in a second state referred to as "excited".

When the first sensor 11 is a GMR sensor, i.e. when the first magnetoresistive element 11_MR is a spin valve, the first and second electrical contacts 11_ct1 and 11_ct2 are taken at the two lateral ends of the spin valve, such as shown in FIGS. 3a and 3b. According to an alternative not shown, the first sensor 11 can also comprise third and fourth electrical contacts, which makes it possible to be freed from contact resistances. According to an alternative not shown, when the first sensor 11 is a TMR sensor, i.e. when the first magnetoresistive element 11_MR is a magnetic tunnel junction, the first and second contacts 11_ct1 and 11_ct2 are taken one under the stack and the other on the stack in such a way that a current can pass through perpendicularly to the tunnel barrier.

The second sensor 12 comprises:
a second flux concentrator 12_CF, comprising a first magnetic part 12_PM1, a second magnetic part 12_PM2 and an air gap 12_E between the first and second magnetic parts;
a second magnetoresistive element 12_MR arranged in the air gap 12_E of the second flux concentrator 12_CF;
a first electrical contact 12_ct1 and a second electrical contact 12_ct2;
a first permanent magnet 12_A1 and a second permanent magnet 12_A2 arranged on either side of the second magnetoresistive element 12_MR.

When the second sensor 12 is a GMR sensor, i.e. when the second magnetoresistive element 12_MR is a spin valve, the first and second electrical contacts 12_ct1 and 12_ct2 are taken at the two lateral ends of the spin valve, such as shown in FIGS. 3a and 3b. According to an alternative not shown, the second sensor 12 can also comprise third and fourth electrical contacts, which makes it possible to be freed from contact resistances. According to an alternative not shown, when the second sensor 12 is a TMR sensor, i.e. when the second magnetoresistive element 12_MR is a magnetic tunnel junction, the first and second contacts 12_ct1 and 12_ct2 are taken one under the stack and the other on the stack in such a way that a current can pass through perpendicularly to the tunnel barrier.

The first flux concentrator 11_CF has a first dimension 11_D1, referred to as "large dimension", and a second dimension 11_D2, referred to as "small dimension". The large dimension 11_D1 of the first flux concentrator is according to the first X axis, The small dimension 11_D2 of the first flux concentrator is according to the second Y axis. In order to create a dissymmetry in order to differentiate the measurements according to the two directions X and Y, the small dimension 11_D2 is greater than the large dimension 11_D1 (the same applies to the small dimension 12_D2 and to the large dimension 12_D1). A factor 1.5 is sufficient to obtain this differentiation. Therefore, the large dimension 11_D1 and the small dimension 11 D2 of the first flux concentrator are such that:

$$1.5 \times 11\_D2 \leq 11\_D1$$

The second flux concentrator 12_CF also has a first dimension 12_D1, referred to as "large dimension", and a second dimension 12_D2, referred to as "small dimension". This time, the large dimension 12_D1 of the second flux concentrator is according to the second Y axis. The small dimension 12_D2 of the second flux concentrator is according to the first Y axis. The large dimension 12_D1 and the small dimension 12_D2 of the second flux concentrator are such that:

$$1.5 \times 12\_D2 \leq 12\_D1$$

Moreover, the concentrators are as long as possible since the greater the large dimension is the more the magnetic component oriented according to the direction of the large dimension is amplified in the air gap of the flux concentrator, until reaching a maximum value asymptotically. In an embodiment, $11\_D1 \geq 10 \times 11\_D2$ and beneficially $11\_D1 \geq 30 \times 11\_D2$. Likewise, $12\_D1 \geq 10 \times 12\_D2$ and beneficially $12\_D1 \geq 30 \times 12\_D2$.

The first and second flux concentrators 11_CF and 12_CF are typically made from a soft material having a linear susceptibility, such as for example Permalloy $Ni_{80}Fe_{20}$, Supermalloy $Ni_{75}Fe_{20}Mo_5$ or a $Co_{90}Fe_{10}$ alloy.

A dimensioning example for the first and second flux concentrators 11_CF and 12_CF is described later, in reference to FIG. 4a. Several examples of alternative geometries for the first and second flux concentrators 11_CF and 12_CF are described later, in reference to FIGS. 6a to 6d.

The air gap 11_E of the first flux concentrator is oriented substantially parallel to a direction XY which is the bisector of the first X axis and of the second Y axis. In order to obtain such an orientation for the air gap 11_E of the first flux concentrator, the first magnetic part 11_PM1 of the first flux concentrator has a bevelled side 11_PM1_Ch according to the direction XY, and the second magnetic part 11_PM2 of the first flux concentrator has a bevelled side 12_PM2_Ch according to the direction XY.

Similarly, the air gap 12_E of the second flux concentrator is oriented substantially parallel to the direction XY. In order to obtain such an orientation for the air gap 12_E of the second flux concentrator, the first magnetic part 12_PM1 of the second flux concentrator has a bevelled side 12_PM1_Ch according to the direction XY, and the second magnetic part 12_PM2 of the second flux concentrator has a bevelled side 12_PM2_Ch according to the direction XY.

In the first state of rest, the field created by the first flux concentrator 11_CF in its air gap 11_E is negligible, and the field created by the second flux concentrator 12_CF in its air gap 12_E is negligible.

The first magnetoresistive element 11_MR comprises:
a reference layer, also called "trapped layer", having a fixed magnetisation direction 11_Mref, and
a sensitive layer, also called "soft layer", having a variable magnetisation direction 11_Mvar.

Similarly, the second magnetoresistive element 12_MR comprises:
a reference layer, also called "trapped layer", having a fixed magnetisation direction 12_Mref, and
a sensitive layer, also called "soft layer", having a variable magnetisation direction 12_Mvar.

The trapping of the reference layer of the first magnetoresistive element 11_MR is in general carried out by interaction with an antiferromagnetic layer adjacent to the reference layer, by an anisotropic exchange mechanism. Likewise, the trapping of the reference layer of the second magnetoresistive element 12_MR is in general carried out by an anisotropic exchange mechanism, by interaction with an antiferromagnetic layer adjacent to the reference layer. Alternatively, the reference layer of the first magnetoresistive element 11_MR can be a synthetic antiferromagnetic layer comprising two ferromagnetic layers coupled in an antiparallel manner through a fine layer of antiparallel coupling. This synthetic antiferromagnetic layer can itself be trapped by interaction with another antiferromagnetic layer. Likewise, the reference layer of the second magnetoresistive element 12_MR can alternatively be a synthetic antiferromagnetic layer such as described hereinabove. The antiferromagnetic material of the antiferromagnetic layer of the first magnetoresistive element 11_MR is in an embodiment identical to the antiferromagnetic material of the antiferromagnetic layer of the second magnetoresistive element 12_MR. This as such allows for the simultaneous manufacture of the first and second magnetoresistive elements.

The fixed magnetisation direction 11_Mref of the reference layer of the first magnetoresistive element is substantially identical to the fixed magnetisation direction 12_Mref of the reference layer of the second magnetoresistive element. As such, the fixed magnetisation direction 11_Mref of the reference layer of the first magnetoresistive element and the fixed magnetisation direction 12_Mref of the reference layer of the second magnetoresistive element are defined and obtained during a single and same technological step. In the case where the first and second sensors 11 and 12 are sensors with giant magnetoresistance GMR, also called "spin valves", this single technological step is typically the following:

the antiferromagnetic layer of the first sensor 11 and the antiferromagnetic layer of the second sensor 12, which are made in an embodiment from the same antiferromagnetic material and therefore have the same blocking temperature, are heated to a temperature that exceeds the blocking temperature. When the temperature of the antiferromagnetic layer of the first sensor 11 exceeds the blocking temperature, the magnetisation direction 11_Mref of the reference layer of the first sensor is no longer trapped by the antiferromagnetic layer and can then be modified. Likewise, when the temperature of the antiferromagnetic layer of the second sensor 12 exceeds the blocking temperature, the magnetisation direction 12_Mref of the reference layer of the second sensor can be modified.

While maintaining a temperature that exceeds the blocking temperature, the magnetisation direction 11_Mref of the reference layer of the first sensor and the magnetisation direction 12_Mref of the reference layer of the second sensor are then defined simultaneously by the application of a field oriented in the desired direction.

Finally, the heating is stopped: the antiferromagnetic layer of the first sensor 11 and the antiferromagnetic layer of the second sensor 12 return to a temperature that is lower than their blocking temperature. The application of the field oriented in the desired direction is maintained until the antiferromagnetic layer of the first sensor 11 and the antiferromagnetic layer of the second sensor 12 again have a temperature less than their blocking temperature. The magnetisation direction 11_Mref of the reference layer of the first sensor and the magnetisation direction 12_Mref of the reference layer of the second sensor are then trapped in the direction defined hereinabove.

In the example shown in FIG. 3a, the fixed magnetisation direction 11_Mref of the reference layer of the first magnetoresistive element and the fixed magnetisation direction 12_Mref of the reference layer of the second magnetoresistive element are both defined substantially perpendicularly to the direction XY.

The variable magnetisation direction 11_Mvar of the sensitive layer of the first magnetoresistive element is polarised transversally in relation to the fixed magnetisation direction 11_Mref of the reference layer of the first magnetoresistive element, thanks to the first permanent magnet 11_A1 and to the second permanent magnet 11_A2 arranged on either side of the first magnetoresistive element 11_MR. The first and second permanent magnets 11_A1 and 11_A2 of the first sensor 11 have the same magnetisation direction 11_Hbias, which defines the polarisation of the variable magnetisation direction 11_Mvar of the sensitive layer of the first magnetoresistive element. When no magnetic field to be measured is applied to the first sensor 11, i.e. when the first sensor 11 is in a state of rest, the variable magnetisation direction 11_Mvar of the first magnetoresistive element is according to the magnetisation direction 11_Hbias of the first and second permanent magnets 11_A1 and 11_A2 of the first sensor 11.

Similarly, the variable magnetisation direction 12_Mvar of the sensitive layer of the second magnetoresistive element is polarised transversally in relation to the fixed magnetisation direction 12_Mref of the reference layer of the second magnetoresistive element, thanks to the first permanent magnet 12_A1 and to the second permanent magnet 12_A2 arranged on either side of the first magnetoresistive element 12_MR. The first and second permanent magnets 12_A1 and 12_A2 of the second sensor 12 have the same magnetisation direction 12_Hbias, which defines the polarisation of the variable magnetisation direction 12_Mvar of the sensitive layer of the second magnetoresistive element. When no magnetic field to be measured is applied to the second sensor 12, i.e. when the second sensor 12 is in a state of rest, the variable magnetisation direction 12_Mvar of the second magnetoresistive element is according to the magnetisation direction 12_Hbias of the first and second permanent magnets 12_A1 and 12_A2 of the second sensor 12.

The first and second permanent magnets 11_A1 and 11_A2 of the first sensor 11 are in an embodiment made from a material that is identical to the material of the first and second permanent magnets 12_A1 and 12_A2 of the second sensor 12. This as such allows them to be manufactured simultaneously. Each permanent magnet is typically made from a hard material, such as an alloy with a base of Co and of Cr, or of Sm and of Co, or of NdFeB in thin layers.

The magnetisation direction 11_Hbias of the first and second permanent magnets 11_A1 and 11_A2 of the first sensor 11 is beneficially identical to the magnetisation direction 12_Hbias of the first and second permanent magnets 12_A1 and 12_A2 of the second sensor 12. As such, the magnetisation direction 11_Hbias of the first and second permanent magnets 11_A1 and 11_A2 of the first sensor 11 and the magnetisation direction 12_Hbias of the first and second permanent magnets 12_A1 and 12_A2 of the second sensor 12 are beneficially defined and obtained during a single and same technological step. This single technological step typically consists in applying a strong magnetic field, greater than the coercive field of the material of the permanent magnets, oriented in the desired direction. The application of this strong magnetic field induces in each permanent magnet a remanent magnetisation in the desired direction.

In the example shown in FIG. 3a, the magnetisation direction 11_Hbias of the permanent magnets of the first sensor 11 and the magnetisation direction 12_Hbias of the permanent magnets of the second sensor 12 are both defined substantially parallel to the direction XY.

FIG. 3b shows a diagrammatical representation of the magnetic field sensor 10 for the detection of at least two magnetic field components according to the first embodiment of the invention, in a second state referred to as "excited". In the excited state, a magnetic field B to be measured is applied to the magnetic field sensor 10, and therefore to the first sensor 11 and to the second sensor 12. The magnetic field B to be measured has a first component Bx according to the X axis, and a second component By according to the Y axis. The first sensor 11 is sensitive to the first component Bx while the second sensor 12 is sensitive to the second component By. Under the effect of the magnetic field B to be measured, the first flux concentrator 11_CF radiates a first magnetic field on its air gap 11_E and the second flux concentrator 12_CF radiates a second magnetic field on its air gap 12_E. The first magnetic field is oriented in a direction substantially perpendicular to the magnetisation direction 11_Hbias of the permanent magnets of the first sensor 11. The second magnetic field is oriented in a direction substantially perpendicular to the magnetisation direction 12_Hbias of the permanent magnets of the first sensor 12. The first and second magnetic fields are therefore oriented according to the same direction. In the example shown in FIG. 3b, the first and second magnetic fields are as such oriented substantially perpendicularly to the direction XY.

The magnetisation direction 11_Mvar of the soft layer of the first magnetoresistive element 11_MR varies under the effect of the first magnetic field, which is radiated in the air gap 11_E of the first flux concentrator according to a direction that is different from the direction of polarisation of the soft layer of the first magnetoresistive element 11_MR. Likewise, the magnetisation direction 12_Mvar of the soft layer of the second magnetoresistive element 12_MR varies under the effect of the second magnetic field, which is radiated in the air gap 12_E of the second flux concentrator according to a direction that is different from the direction of polarisation of the soft layer of the second magnetoresistive element 12_MR.

The first magnetoresistive element 11_MR and the second magnetoresistive element 12_MR are of the same type, i.e. for example they are both spin valves, or both magnetic tunnel junctions, or both elements with anisotropic magnetoresistance. The first magnetoresistive element 11_MR and the second magnetoresistive element 12_MR are furthermore made from the same materials. As shown in FIGS. 3a and 3b, the first magnetoresistive element 11_MR and the second magnetoresistive element 12_MR have the same spatial orientation in the plane defined by the X and Y axes: the first magnetoresistive element 11_MR and the second magnetoresistive element 12_MR are both oriented substantially parallel to the direction XY. The second magnetoresistive element 12_MR is simply translated in relation to the first magnetoresistive element 11_MR. On the other hand, the first flux concentrator 11_CF and the second flux concentrator 12_CF do not have the same spatial orientation in the plane defined by the X and Y axes: the first flux concentrator 11_CF has its large dimension 11_D1 according to the X axis and the second flux concentrator 12_CF has its large dimension 12_D1 according to the Y axis. The geometry and the orientation of each flux concentrator contribute to determining the axis of sensitivity of each uniaxial sensor.

FIG. 4a diagrammatically shows the first flux concentrator 11_CF of the first sensor 11. Recall that the first sensor 11 is intended to detect a magnetic field component according to the X axis. The large dimension 11_D1 of the first flux concentrator 11_CF is as such according to the X axis, while the small dimension 11_D2 of the first flux concentrator is according to the Y axis. The air gap 11_E of the first flux concentrator is oriented substantially at 45° from the large dimension 11_D1 of the first flux concentrator, i.e. substantially according to the direction XY.

The first magnetic part 11_PM1 of the first flux concentrator has:
  a first side or small side 11_PM1_Lo1 according to the X axis;
  a second side or large side 11_PM1_Lo2 according to the X axis;
  a side 11_PM1_La according to the Y axis;
  the bevelled side 11_PM1_Ch according to the direction XY;
  a thickness, not shown in FIG. 4a, according to a direction Z perpendicular to the plane OXY defined by the X and Y axes.

The second magnetic part 11_PM2 of the first flux concentrator has:

a first side or small side 11_PM2_Lo1 according to the X axis;

a second side or large side 11_PM2_Lo2 according to the X axis;

a side 11_PM2_La according to the Y axis;

the bevelled side 11_PM2_Ch according to the direction XY;

a thickness, not shown in FIG. 4*a*, according to the direction Z.

In the example shown in FIG. 4*a*, the dimensioning of the first magnetic part 11_PM1 of the first flux concentrator is the following:

the small side 11_PM1_Lo1 according to the X axis measures 400 nm;

the large side 11_PM1_Lo2 according to the X axis measures 600 nm;

the side 11_PM1 according to the Y axis measures 200 nm;

the thickness is 40 nm.

Likewise, the dimensioning of the second magnetic part 11_PM2 of the first flux concentrator is the following:

the small side 11_PM2_Lo1 according to the X axis measures 400 nm;

the large side 11_PM2_Lo2 according to the X axis measures 600 nm;

the side 11_PM2 according to the Y axis measures 200 nm;

the thickness is 40 nm.

Similarly, the first magnetic part 12_PM1 of the second flux concentrator 12_CF typically has:

a first side or small side according to the Y axis measuring 400 nm;

a second side or large side according to the Y axis measuring 600 nm;

a side according to the X axis measuring 200 nm;

the bevelled side 12_PM1_Ch according to the direction XY a thickness of 40 nm according to the direction Z.

The second magnetic part 12_PM2 of the second flux concentrator 12_CF typically has:

a first side or small side according to the Y axis measuring 400 nm;

a second side or large side according to the Y axis measuring 600 nm;

a side according to the X axis measuring 200 nm;

the bevelled side 12_PM2_Ch according to the direction XY;

a thickness of 40 nm according to the direction Z.

A first configuration of the first and second magnetic parts of each flux concentrator is shown in FIG. 4*a*, as well as in FIGS. 3*a* and 3*b*. In a flux concentrator according to the first configuration, the first magnetic part and the second magnetic part are misaligned, i.e. the large side of the first magnetic part and the small side of the second magnetic part are not aligned. The first magnetic part and the second magnetic part are translated with respect to one another parallel to the direction XY, i.e. parallel to the orientation of the air gap, in such a way that the large dimension of the flux concentrator is less than or equal to the sum of the large side of the first magnetic part and of the small side of the second magnetic part. As such, in the example of the first sensor 11, the large side 11_PM1_Lo2 of the first magnetic part 11_PM1 and the small side 11_PM2_Lo1 of the second magnetic part 11_PM2 are not aligned and have a different ordinate according to the Y axis. The large dimension 11_D1 is equal to the sum of the large side 11_PM1_Lo2 of the first magnetic part and of the small side 11_PM2_Lo1 of the second magnetic part. The small dimension 11_D2 is greater than the width of the side 11_PM1_La of the first magnetic part 11_PM1, and the small dimension is greater than the width of the side 11_PM2_La of the second magnetic part 11_PM2.

FIG. 4*b* diagrammatically shows an alternative flux concentrator 11'_CF having a second configuration. According to the second configuration, the first magnetic part 11'_PM1 and the second magnetic part 11'_PM2 of the alternative flux concentrator 11'_CF are aligned; as such the large side 11'_PM1_Lo2 of the first magnetic part 11'_PM1 and the small side 11'_PM2_Lo1 of the second magnetic part 11'_PM2 have the same ordinate according to the Y axis, and likewise the small side 11'_PM1_Lo1 of the first magnetic part 11'_PM1 and the large side 11'_PM2_Lo2 of the second magnetic part have the same ordinate according to the Y axis. Still according to the second configuration, the large dimension 11'_D1 is greater than the sum of the large side 11'_PM1_Lo2 of the first magnetic part and of the small side 11'_PM2_Lo1 of the second magnetic part. The small dimension 11'_D2 is equal to the width of the side 11'_PM1_La of the first magnetic part 11'_PM1 and to the width of the side 11'_PM2_La of the second magnetic part 11'_PM2.

Figure 4C:
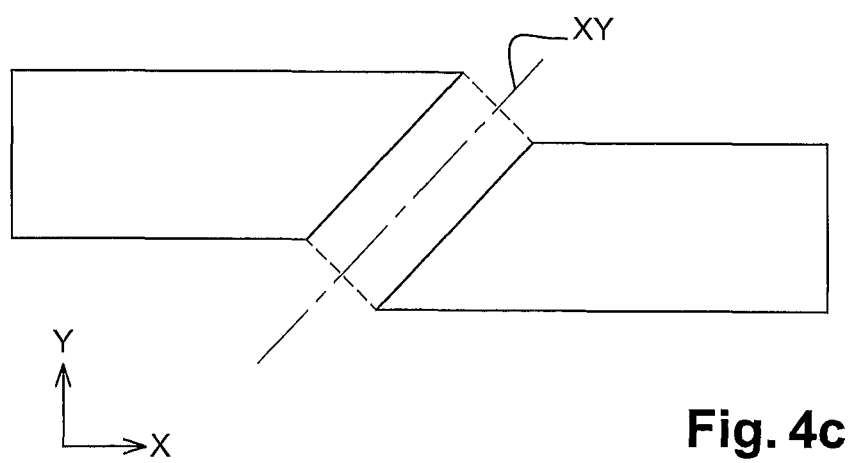
FIG. 4c diagrammatically shows a third alternative configuration of a flux concentrator of a sensor for the detection of a magnetic field component according to the first direction.

Thanks to the misalignment, the magnetic flux indeed turns 45° in the entire width of the air gap until very close to the edges. Without the misalignment, the flux tends to no longer turn 45° on the edges of the air gap and rather pass straight according to the first direction. As such, a solution can consist in using an intermediate configuration between that of FIGS. 4*a* and 4*b*. Such a configuration is shown in FIG. 4*c* and corresponds to the case where the upper right corner of the left polar part and the upper left corner of the right polar part are on the same line perpendicular to the diagonal XY. In this case, the air gap has exactly the shape of a rectangle of great length parallel to XY.

Figure 5A:
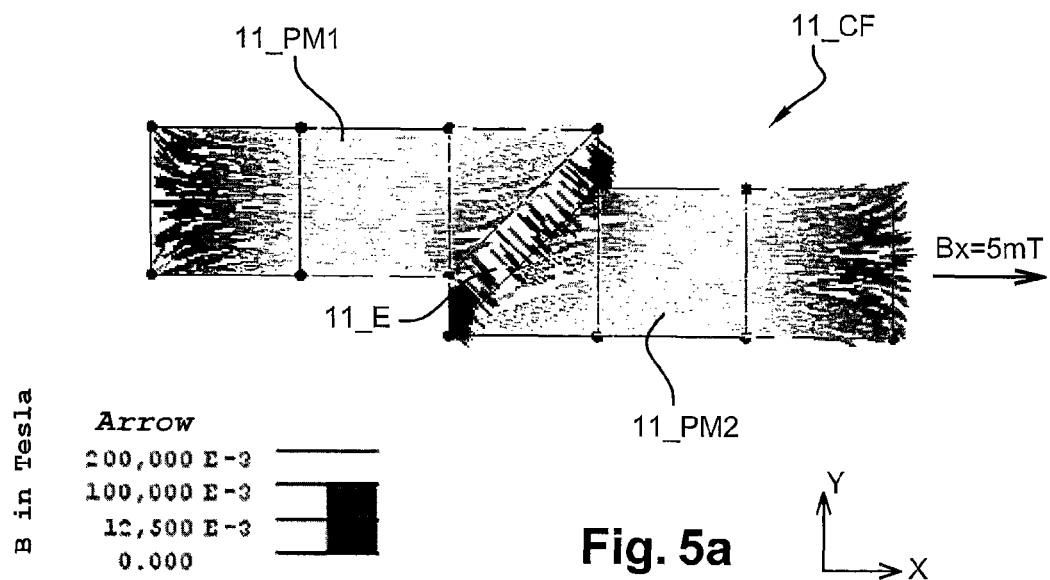
FIG. 5a shows the result of a first simulation according to which a magnetic field to be measured oriented according to the first direction is applied to the flux concentrator of a sensor intended to detect a magnetic field component according to the first direction.
Figure 5B:
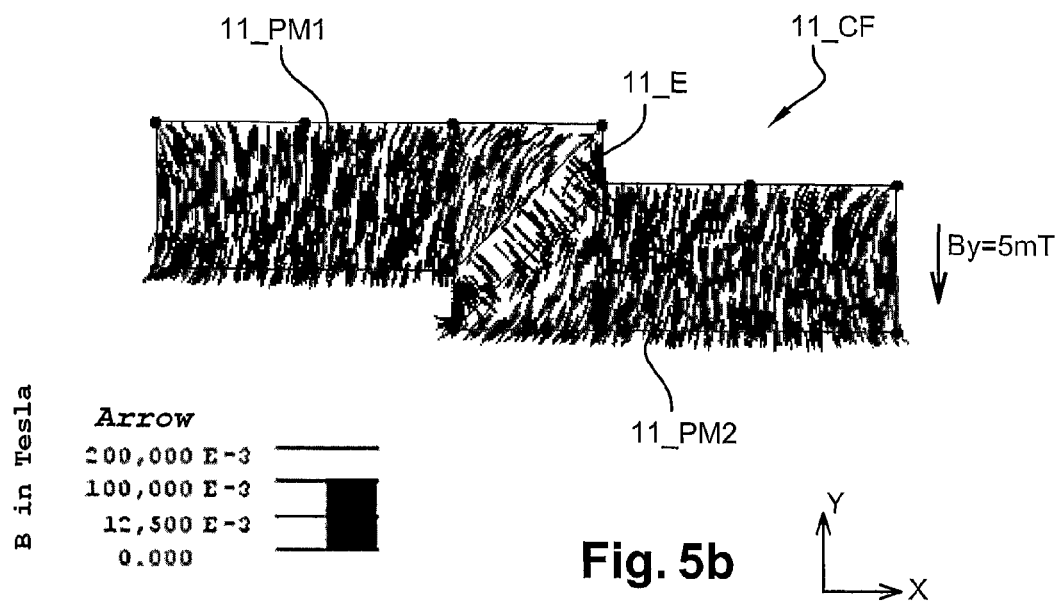
FIG. 5b shows the result of a second simulation according to which a magnetic field to be measured oriented according to a second direction is applied to the flux concentrator of the sensor of FIG. 5a, intended to detect a magnetic field component according to the first direction.

FIG. 5*a* shows the result of a first simulation according to which a magnetic field to be measured oriented according to the direction X is applied to the first flux concentrator 11_CF of the first sensor 11 intended to detect a magnetic field component according to the X axis. FIG. 5*b* shows the result of a second simulation according to which a magnetic field to be measured oriented according to the direction Y is applied to the first flux concentrator 11_CF of the first sensor 11 intended to detect a magnetic field component according to the X axis, The simulation is carried out for the case where the first magnetic part 11_PM1 and the second magnetic part 11_PM2 of the first flux concentrator are made from NiFe, with isotropic permeability X=1000 and of saturation magnetisation $\mu_0 M_S$=1 Tesla. The simulation is carried out for the case of the dimensioning that was described hereinabove.

In FIG. 5*a*, a magnetic field Bx of 5 mT is applied to the first flux concentrator 11_CF. The magnetic field Bx is oriented according to the X axis, therefore according to the large dimension 11_D1 of the first flux concentrator. The result of the first simulation shows that the magnetic field Bx of 5 mT applied to the first flux concentrator 11_CF results in the formation in the air gap 11_E of a field oriented substantially according to the direction XY with a module of 32 mT.

In FIG. 5*b*, a magnetic field By of 5 mT is applied to the first flux concentrator 11_CF. The magnetic field By is oriented according to the Y axis, therefore according to the small dimension 11_D2 of the first flux concentrator. The result of the second simulation shows that the magnetic field By of 5 mT applied to the first flux concentrator 11_CF results in the formation in the air gap 11_E of a field also oriented substantially according to the direction XY, but of which the module is this time only 8 mT.

The first and second simulations therefore show that:
the field that is formed in the air gap of the first flux concentrator 11_CF is strongly amplified when the field applied to the first flux concentrator 11_CF is according to the large dimension 11_D1 of the flux concentrator;
the field that is formed in the air gap of the first flux concentrator 11_CF is weakly amplified when the field applied to the first flux concentrator 11_CF is according to the small dimension 11_D2 of the flux concentrator.

In an embodiment, the magnetic field to be measured is less than the saturation field of the first and second magnetic parts of each flux concentrator, in such a way that the field that is formed in the air gap of each flux concentrator remains in a linear regime of variation according to the magnetic field to be measured. In the particular example of magnetic parts made of NiFe, the linear regime is obtained for weak fields, typically less than 0.5 mT, which is for example suitable so that each flux concentrator is sensitive to a component of the terrestrial field, with the terrestrial field being of a magnitude of 0.05 mT.

Figure 7:
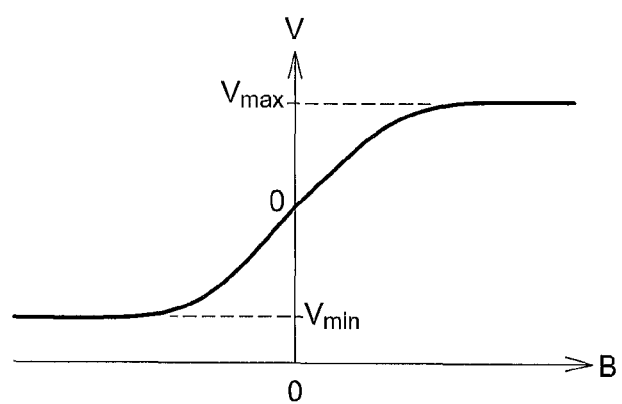
FIG. 7 diagrammatically shows the change in a voltage at the terminals of a magnetoresistive element according to a field applied to the magnetoresistive element and that is sought to be measured.

When the first magnetoresistive element 11_MR of the first sensor 11 is passed through by a current of intensity I, this results in a voltage at its terminals which varies according to the field applied to the first magnetoresistive element 11_MR, i.e. according to the field formed in the air gap 11_E of the first flux concentrator 11_CF. Likewise, when the second magnetoresistive element 12_MR of the second sensor 12 is passed through by a current of intensity I, this results in a voltage at its terminals which varies according to the field that is applied to it, i.e. according to the field formed in the air gap 12_E of the second flux concentrator 12_CF. FIG. 7 diagrammatically shows the change in a voltage V at the terminals of a magnetoresistive element according to a field B applied to the magnetoresistive element and that is sought to be measured. For a certain field range around the zero field, the voltage at the terminals of the magnetoresistive element varies linearly according to the field applied. Outside of this linear range, the voltage at the terminals of the magnetoresistive element gradually saturates. In the case where the magnetoresistive element is a spin valve or a magnetic tunnel junction and where two permanent magnets, arranged on either side of the magnetoresistive element, create a polarisation field that polarises the magnetisation direction of the soft layer, the voltage at the terminals of the magnetoresistive element gradually saturates for field values of a magnitude of the polarisation field. The intensity of the polarisation field is then adjusted according to the field range desired to be measured. It is generally sought to work in the linear operating regime of the magnetoresistive element. In this linear operating regime, the voltage V at the terminals of the magnetoresistive element varies linearly according to the field B acting on the magnetoresistive element:

$$V = \propto B$$

The field B acting on the magnetoresistive element is the field in the air gap of the flux concentrator of the sensor considered. The field formed in the air gap is amplified differently according to the first and second components of the field to be measured. When in the regime of linear permeability of the material of the magnetic parts of the flux concentrators, there is:

$$B = a_x B_x + a_y B_y$$

where $a_x$ is the amplification factor of the flux concentrator considered according to the direction X, $B_x$ is the component of the field applied according to the direction X, $a_y$ is the amplification factor of the flux concentrator considered according to the direction Y and $B_y$ is the component of the field applied according to the direction Y. In the example shown in FIGS. 3a and 3b, the first flux concentrator 11_CF has a strong amplification factor according to the direction X and a low amplification factor according to the direction Y; and on the contrary the second flux concentrator 12_CF has a strong amplification factor according to the direction Y and a low amplification factor according to the direction X.

As such the first magnetoresistive element 11_MR delivers in linear regime a first output voltage V11 such that:

$$V11 = \propto_{11} a_{11x} B_x + \propto_{11} a_{11y} B_y$$

where $a_{11}$ is the linear coefficient of the linear regime of the first magnetoresistive element, $a_{11x}$ is the amplification factor of the first flux concentrator 11_CF according to the direction X and $a_{11y}$ is the amplification factor of the first flux concentrator 11_CF according to the direction Y.

Likewise, the second magnetoresistive element 12_MR delivers in linear regime a second output voltage V12 such that:

$$V12 = \propto_{12} a_{12x} B_x + \propto_{12} a_{12y} B_y$$

where $a_{12}$ is the linear coefficient of the linear regime of the second magnetoresistive element, $a_{12x}$ is the amplification factor of the second flux concentrator 12_CF according to the direction X and $a_{21y}$ is the amplification factor of the second flux concentrator 12_CF according to the direction Y.

The two preceding equations can be written in matrix form:

$$\begin{bmatrix} V11 \\ V12 \end{bmatrix} = M \begin{bmatrix} B_x \\ B_y \end{bmatrix}$$

with:

$$M = \begin{bmatrix} \propto_{11} a_{11x} & \propto_{11} a_{11y} \\ \propto_{12} a_{12x} & \propto_{12} a_{12y} \end{bmatrix}$$

By inverting the matrix M, it is therefore possible to return to the first and second components of the field from the voltage measurements:

$$\begin{bmatrix} B_x \\ B_y \end{bmatrix} = M^{-1} \begin{bmatrix} V11 \\ V12 \end{bmatrix}$$

The matrix M is established during the manufacturing, by calibration of the first sensor 11 and of the second sensor 12 submitted successively to a field according to X and to a field according to Y.

FIGS. 3a, 3b, 4a and 4b showed a first geometry for each magnetic part of each flux concentrator, according to which each magnetic part has a bevel shape. According to the first geometry, each magnetic part comprises as such a bevelled side. Different alternative geometries for each magnetic part of each flux concentrator are now described in FIGS. 6a, 6b, 6c and 6d.

FIG. 6a shows a second possible geometry for each magnetic part of each flux concentrator. FIG. 6a shows as such a flux concentrator 21_CF comprising a first magnetic part 21_PM1 and a second magnetic part 21_PM2 having the second geometry. The first magnetic part 21_PM1 has:
- a first side or small side 21_PM1_Lo1 according to the X axis;
- a second side or large side 21_PM1_Lo2 according to the X axis;
- a first side or large side 21_PM1_La1 according to the Y axis;
- a second side or small side 21_PM1_La2 according to the Y axis;
- a chamfered side 21_PM1_Ch according to the direction XY.

Similarly, the second magnetic part 21_PM2 has:
- a first side or small side 21_PM2_Lo1 according to the X axis;
- a second side or large side 21_PM2_Lo2 according to the X axis;
- a first side or large side 21_PM2_La1 according to the Y axis;
- a second side or small side 21_PM2_La2 according to the Y axis;
- a chamfered side 21_PM2_Ch according to the direction XY.

In the second geometry, the presence of a chamfered side instead of a bevelled side facilitates the carrying out of each magnetic part. Indeed, the chamfered side involves the presence of a second side according to the Y axis that connects the chamfered side with the second side according to the X axis and therefore the suppression of an acute angle that is difficult to carry out.

FIG. 6b shows a third possible geometry for each magnetic part of each flux concentrator. FIG. 6b shows as such a flux concentrator 31_CF comprising a first magnetic part 31_PM1 and a second magnetic part 31_PM2 having third geometry. The first magnetic part 31_PM1 has:
- a first side or large side 31_PM1_Lo1 according to the X axis;
- a second side or small side 31_PM1_Lo2 according to the X axis;
- a side 31_PM1_La1 according to the Y axis;
- a first chamfered side 31_PM1_Ch1 according to the direction XY;
- a second chamfered side 31_PM1_Ch2 connecting the second side 31_PM1_Lo2 according to the X axis and the first chamfered side 31_PM1_Ch1 according to the direction XY.

Similarly, the second magnetic part 31_PM2 has:
- a first side or large side 31_PM2_Lo1 according to the X axis;
- a second side or small side 31_PM2_Lo2 according to the X axis;
- a side 31_PM2_La1 according to the Y axis;
- a first chamfered side 31_PM2_Ch1 according to the direction XY;
- a second chamfered side 31_PM2_Ch2 connecting the second side 31_PM2_Lo2 according to the X axis and the first chamfered side 31_PM2_Ch1 according to the direction XY.

The second side 31_PM1_Ch2 of the first magnetic part 31_PM1 is typically substantially parallel to the second side 31_PM2_Ch2 of the second magnetic part 31_PM2.

In the third geometry, the presence of a second chamfered side in each magnetic part contributes, for a magnetic field applied according to the large dimension of the flux concentrator, to further increasing the concentration and the amplification of the flux within the air gap.

FIG. 6c shows a fourth possible geometry for each magnetic part of each flux concentrator. FIG. 6c shows as such a flux concentrator 41_CF comprising a first magnetic part 41_PM1 and a second magnetic part 41_PM2 having the fourth geometry. The first magnetic part 41_PM1 has:
- a first side or large side 41_PM1_Lo1 according to the X axis;
- a second side or small side 41_PM1_Lo2 according to the X axis;
- a first side or large side 41_PM1_La1 according to the Y axis;
- a second side or small side 41_PM1_La2 according to the Y axis;
- a first chamfered side 41_PM1_Ch1 according to the direction XY;
- a second chamfered side 41_PM1_Ch2 that connects the small side 41_PM1_Lo2 according to the X axis and the small side 41_PM1_La2 according to the Y axis.

Similarly, the second magnetic part 41_PM2 has:
- a first side or large side 41_PM2_Lo1 according to the X axis;
- a second side or small side 41_PM2_Lo2 according to the X axis;
- a first side or large side 41_PM2_La1 according to the Y axis;
- a second side or small side 41_PM2_La2 according to the Y axis;
- a first chamfered side 41_PM2_Ch1 according to the direction XY;
- a second chamfered side 41_PM2_Ch2 that connects the small side 41_PM1_Lo2 according to the X axis and the small side 41_PM1_La2 according to the Y axis.

The fourth geometry combines the benefits of the second and third geometries, i.e. an increased facility in manufacturing and an increase in the amplification of the field formed within the air gap for a field applied oriented according to the large dimension of the flux concentrator.

Figure 6D:
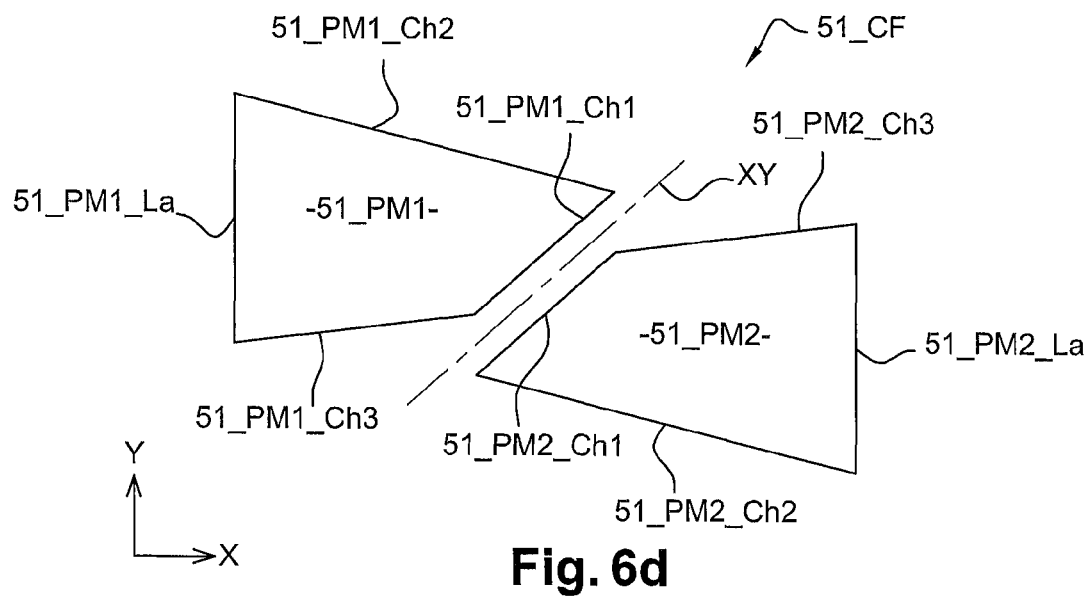
FIG. 6d diagrammatically shows a fifth possible geometry for each magnetic part of each flux concentrator according to an embodiment of the invention.

FIG. 6d shows a fifth possible geometry for each magnetic part of each flux concentrator. FIG. 6d shows as such a flux concentrator 51_CF comprising a first magnetic part 51_PM1 and a second magnetic part 51_PM2 having the fifth geometry. The first magnetic part 51_PM1 has:
- a side 51_PM1_La according to the Y axis;
- a first chamfered side 51_PM1_Ch1 according to the direction XY;
- a second chamfered side 51_PM1_Ch2 connecting a first end of the side 51_PM1_Lo2 according to the Y axis to a first end of the first chamfered side 51_PM1_Ch1 according to the direction XY;
- a third chamfered side 51_PM1_Ch3 connecting a second end of the side 51_PM1_Lo2 according to the Y axis to a second end of the first chamfered side 51_PM1_Ch1 according to the direction XY.

A second aspect of the invention relates to a magnetic field sensor 100 for the detection of at least three magnetic field components.

The magnetic sensor 100 comprises:
- the magnetic field sensor 10 described hereinabove, that comprises the first sensor 11 for the detection of a first magnetic component according to the first X axis and the second sensor 12 for the detection of a second magnetic component according to the second Y axis;
- a third sensor 13 for the detection of a third magnetic component according to a third axis Z different from the first X axis and from the second Y axis.

The third sensor 13 comprises:
third flux concentrator 13_CF, comprising a first magnetic part 13_PM1, a second magnetic part 13_PM2 and an air gap 13_E between the first and second magnetic parts;
a first magnetoresistive element 13_MR arranged in the air gap 13_E of the first flux concentrator 13_CF;
a first electrical contact 13_ct1 and a second electrical contact 13_ct2;
a first permanent magnet 13_A1 and a second permanent magnet 13_A2 (not shown but referenced for better clarity) arranged on either side of the first magnetoresistive element 13_MR.

The third flux concentrator 13_CF has a first dimension 13_D1 referred to as "large dimension" according to a direction substantially perpendicular to the third direction Z, and a second dimension 13_D2 referred to as "small dimension" according to a direction substantially parallel to the direction XY.

The third axis Z is outside the plane OXY defined by the first X axis and by the second Y axis. The third axis Z is substantially perpendicular to the plane OXY. The closer the angle formed between the plane OXY and the third axis Z is to 90°, the more the sensitivity of the third sensor 13 to the magnetic component according to the third axis Z increases, and the more the sensitivity of the third sensor 13 to the magnetic components according to the first X axis and the second Y axis decreases. If the third axis Z is not perpendicular to the plane OXY, the third sensor 13 for the detection of the magnetic component according to the third axis Z is also sensitive, to a lesser degree, to the magnetic components according to the first X axis and according to the second Y axis.

The third magnetoresistive element 13_MR is of the same type as the first magnetoresistive element 11_MR and the second magnetoresistive element 12_MR, i.e. for example they are all three spin valves, or all three magnetic tunnel junctions, or all three elements with anisotropic magnetoresistance. The first magnetoresistive element 11_MR, the second magnetoresistive element 12_MR and the third magnetoresistive element 13_MR are furthermore in an embodiment made from the same materials.

Similarly to the first and second magnetoresistive elements 11_MR and 12_MR described hereinabove, the third magnetoresistive element 13_MR comprises:
a reference layer having a fixed magnetisation direction 13_Mref, and
a sensitive layer having a variable magnetisation direction 13_Mvar.

The variable magnetisation direction 13_Mvar of the sensitive layer of the third magnetoresistive element is polarised transversally in relation to the fixed magnetisation direction 13_Mref of the reference layer of the third magnetoresistive element, thanks to the first and second permanent magnets arranged on either side of the first magnetoresistive element 13_MR, according to a principle which has been described hereinabove in liaison with the first and second sensors 11 and 12.

The magnetic field sensor 100 for the detection of at least three magnetic field components is in an embodiment manufactured thanks to a method comprising the following steps, in this order:
a first step 101 of carrying out:
the first sensor 11 on a face of a first region Reg1 of a substrate extending according to the plane OXY, the second sensor 12 on a face of a second region Reg2 of the substrate, and
the third sensor 13 on a face of a third region Reg3 of the substrate;
a second step 102 according to which a first portion of the third region Reg3 of the substrate, the first portion comprising the face whereon the third sensor 13 is carried out, is separated from the rest of the substrate, the first portion protruding from the reference plane OXY.

Thanks to this method of manufacture, the first, second and third sensors 11, 12 and 13 can be carried out in a relatively simple manner, during the same set of technological steps on the surface of the same substrate. At the end of the first step 101, the first, second and third sensors 11, 12 and 13 are substantially in the same plane. The third sensor 13 is then raised, during the second step 2, in order to protrude from the plane of the first and second sensors 11 and 12. At the end of the second step 102, the third sensor 13 is outside the plane of the first and second sensors 11 and 12. At the end of the second step 102, the large dimension of the third flux concentrator is according to the direction Z.

Figure 8:
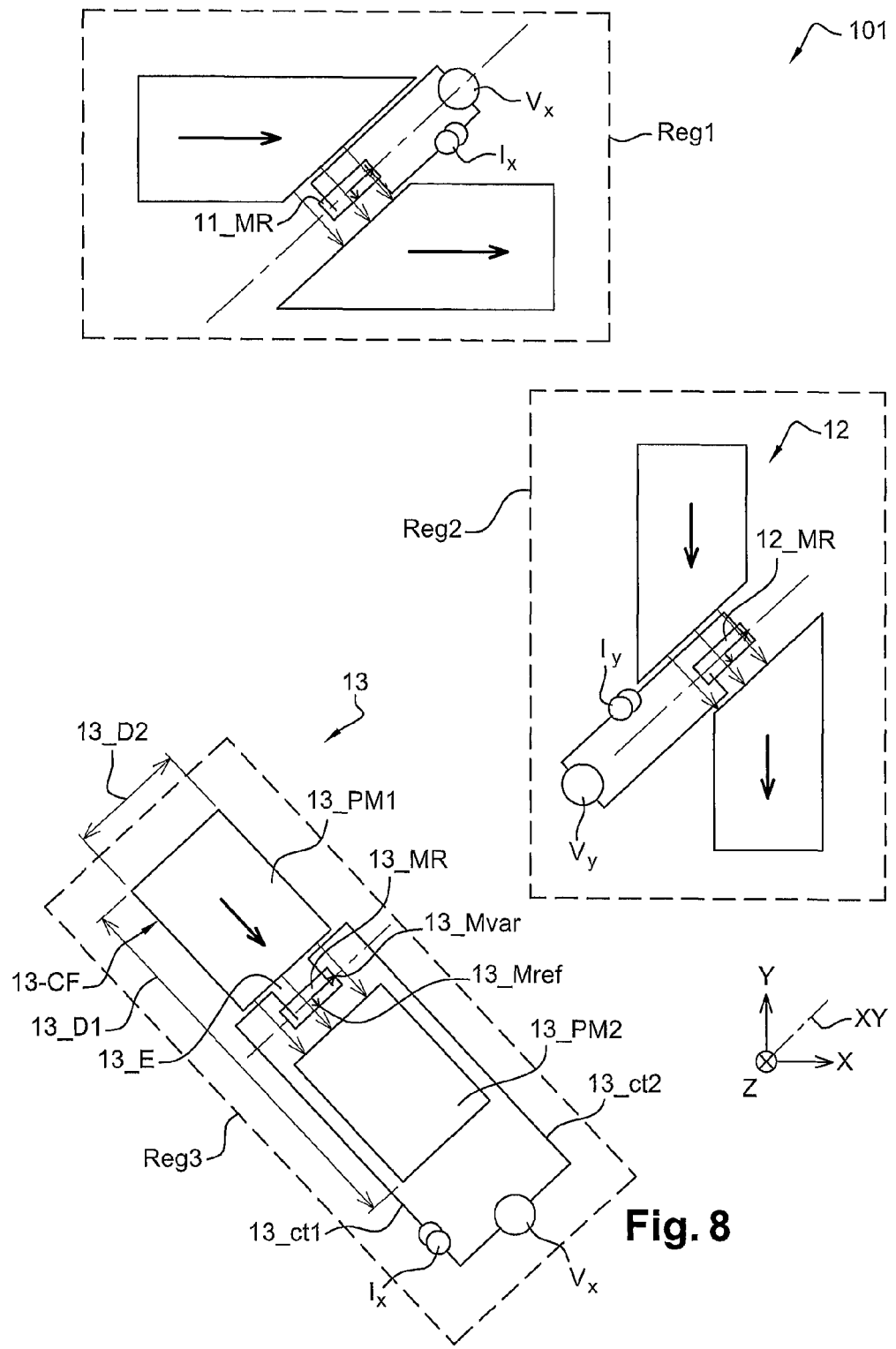
FIG. 8 diagrammatically shows a magnetic field sensor for the detection of at least three magnetic field components according to another aspect of the invention, at the end of a first step of manufacturing.

FIG. 8 diagrammatically shows the magnetic field sensor at the end of the first step 101. FIG. 8 shows that the first magnetoresistive element 11_MR, the second magnetoresistive element 12_MR and the third magnetoresistive element 13_MR of the magnetic sensor 100 have the same spatial orientation in the plane defined by the X and Y axes: the first magnetoresistive element 11_MR, the second magnetoresistive element 12_MR and the third magnetoresistive element 13_MR are all three oriented substantially parallel to the direction XY. The second magnetoresistive element 12_MR is simply translated in relation to the first magnetoresistive element 11_MR, and likewise the third magnetoresistive element 13_MR is simply translated in relation to the first magnetoresistive element 11_MR. As such, the following can be defined during a single technological step:
the fixed magnetisation direction of the reference layer of the first magnetoresistive element 11_MR,
the fixed magnetisation direction of the reference layer of the second magnetoresistive element 12_MR, and
the fixed magnetisation direction of the reference layer of the third magnetoresistive element 13_MR.

To do this, in the case where each magnetic field sensor comprises a antiferromagnetic layer for the trapping of the fixed magnetisation direction of its reference layer, we proceed for example in a manner similar to the method that was described hereinabove in the case of the magnetic field sensor 10:
the antiferromagnetic layer of the first sensor 11, the antiferromagnetic layer of the second sensor 12 and the antiferromagnetic layer of the third sensor 13, which are in an embodiment made from the same antiferromagnetic material and therefore have the same blocking temperature, are heated to a temperature that exceeds the blocking temperature.
While maintaining a temperature that exceeds the blocking temperature, the magnetisation direction of the reference layer of the first sensor, the magnetisation direction of the reference layer of the second sensor and the magnetisation direction of the reference layer of the third sensor are defined simultaneously by the application of a field oriented in the desired direction.
The heating is stopped while still maintaining the application of the field oriented in the desired direction.
The application of the field oriented in the desired direction is stopped when the antiferromagnetic layer of the first sensor 11, the antiferromagnetic layer of the second sensor 12 and the antiferromagnetic layer of the third sensor 13 again have a temperature less than their blocking temperature.

It has been explained hereinabove that each one of the first, second and third sensors 11, 12 and 13 comprises the first and second permanent magnets which polarise the variable magnetisation direction of the reference layer of each sensor. The first and second permanent magnets of the third sensor 13 are made from a material that is identical to the material of the first and second permanent magnets of the second sensor 12 and to the material of the first and second permanent magnets of the first sensor 11. This makes it possible to manufacture them simultaneously. The magnetisation direction of the first and second permanent magnets of the third sensor 13 is identical to the magnetisation direction of the first and second permanent magnets of the second sensor 12 and to the magnetisation direction of the first and second permanent magnets of the first sensor 11. As such, the magnetisation direction of the permanent magnets of the first, second and third sensors 11, 12 and 13 is defined and obtained during a single and same technological step. This single technological step typically consists, as described hereinabove, in the application of a strong magnetic field, greater than the coercive field of the material of the permanent magnets, oriented in the desired direction. The application of this strong magnetic field induces in each permanent magnet a remanent magnetisation in the desired direction. In the example shown in FIG. 8, the magnetisation direction of the permanent magnets of the first, second and third sensors 11, 12 and 13 is defined substantially parallel to the direction XY.

Figure 9:
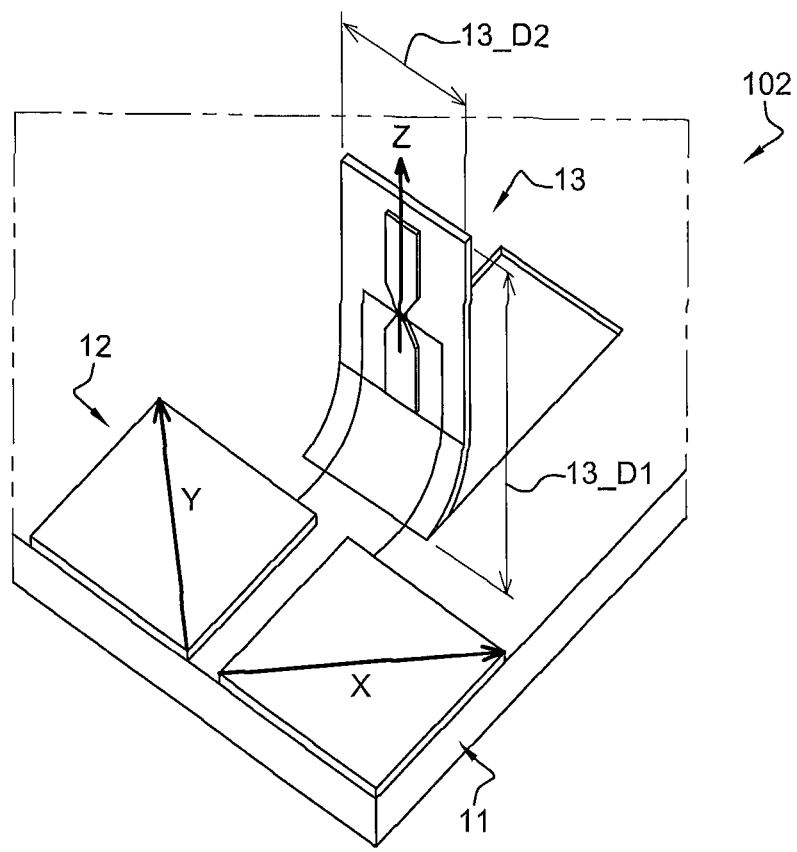
FIG. 9 diagrammatically shows the magnetic field sensor for the detection of at least three magnetic field components according to another aspect of the invention, at the end of a second step of manufacturing.

FIG. 9 diagrammatically shows the magnetic field sensor at the end of the second step 102. At the end of the second step 102, the first flux concentrator 11_CF, the second flux concentrator 12_CF and the third flux concentrator 13_CF do not have the same spatial orientation: the first flux concentrator 11_CF has its large dimension according to the X axis, the second flux concentrator 12_CF has its large dimension according to the Y axis and the third flux concentrator 13_CF has its large dimension according to the axis Z. The geometry and the orientation of each flux concentrator contribute to determining the axis of sensitivity of each uniaxial sensor.

Figure 10:
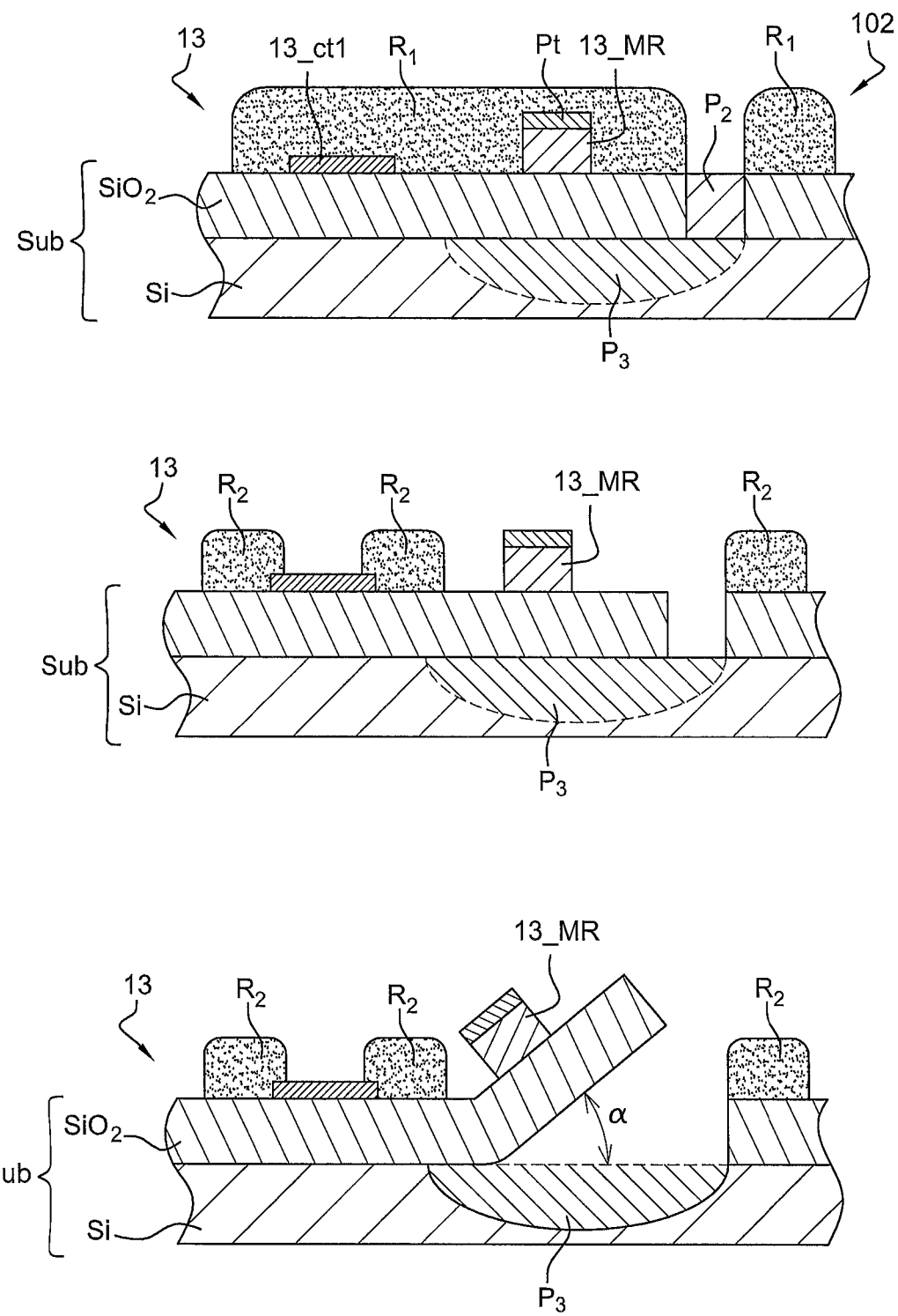
FIG. 10 diagrammatically shows an embodiment of the second step of manufacturing.

FIG. 10 diagrammatically shows an example of carrying out the second step 102 that makes it possible to "release" the third sensor 13 so that it protrudes outside the plane of the first and second sensors 11 and 12.

The second step 102 can for example be carried out by dry anisotropic etching via plasma, or wet via chemicals, of a second portion P2 and by a dry isotropic etching via plasma, or wet via chemicals, of a third portion P3 of the third region Reg3 of the substrate. The substrate is referenced as Sub in FIG. 10. In the example of FIG. 10, the substrate Sub comprises a first layer made from Si and a second layer, that extends over the first layer, made of SiO2. The second portion P2 partially surrounds the first portion comprising the face whereon the third sensor 13 is carried out. The second portion P2 is typically in the second layer made of SiO2 of the substrate Sub. The third portion P3 is located facing opposite the face whereon the third sensor 13 is carried out. The third portion P3 is typically in the first layer made from Si of the substrate Sub.

To do this, a resin R1, for example of the type HS15-12, is deposited, at the end of the first step 101, over the entire device outside of the zone P2. This second zone P2 will be suppressed by anisotropic etching of the SiO2. The resin R1 will then be removed and a new resin R2 for example of the type SU-8 will be deposited on the zones to be preserved and opened on the contacts as this resin will be retained in the final device.

The resin R2 can alternatively be a photosensitive resin other than SU-8, or a structuring polymer, or a metal oxide. An isotropic etching is then carried out of the third portion P3 in Si, with the magnetoresistive element being protected for example by a 100 nm thick layer of platinum. The first region Reg1 and the second region Reg2 of the substrate are not etched.

At the end of the second step 102, after the third sensor 13 has been raised, by releasing the constraints, outside the plane wherein it was initially manufactured, there is provided a step of encapsulation of the third sensor 13. The step of encapsulation is for example carried out by fixing the third sensor 13 in a polymer or in an oxide. The step of encapsulation of the third sensor 13 can as such be carried out by evaporation, growth, spray or deposit of an oxide or of a polymer. By "embedding" as such the third sensor 13 raised in a material that freezes it, the orientation of the third sensor 13 is prevented from changing, for example under the effect of impacts or even variations in temperature, which would modify the response in the field of the third sensor 13.

In a manner that is comparable with what was described hereinabove in liaison with FIG. 7, it is generally sought to work in the linear operating regime of each magnetoresistive element of the magnetic field sensor 100. In this linear operating regime, the voltage V at the terminals of each magnetoresistive element varies linearly according to the field B acting on the magnetoresistive element:

$$V = \alpha B$$

The field B acting on each magnetoresistive element is the field in the air gap of the flux concentrator of the sensor considered. When in the regime of linear permeability of the material of the magnetic parts of the flux concentrators, there is:

$$B = a_x B_x + a_y B_y + a_z B_z$$

where $a_y$ is the amplification factor of the flux concentrator considered according to the direction Y and $B_z$ is the component of the field applied according to the direction Z.

In the example shown in FIG. 8, the first flux concentrator 11_CF has a strong amplification factor according to the direction X and a low amplification factor according to the directions Y and Z; the second flux concentrator 12_CF has a strong amplification factor according to the direction Y and a low amplification factor according to the directions X and Z; and the third flux concentrator 13_CF has a strong amplification factor according to the direction Z and a low amplification factor according to the directions X and Y.

In its linear regime of operation, the first magnetoresistive element 11_MR delivers a first output voltage V11 such that:

$$V11 = \alpha_{11} a_{11x} B_x + \alpha_{11} a_{11y} B_y + \alpha_{11} a_{11z} B_z$$

where $a_{11z}$ is the amplification factor of the first flux concentrator 11_CF according to the direction Z.

Likewise, the second magnetoresistive element 12_MR delivers in linear regime a second output voltage V12 such that:

$$V12 = \alpha_{12} a_{12x} B_x + \alpha_{12} a_{12y} B_y + \alpha_{12} a_{12z} B_z$$

where $a_{12z}$ is the amplification factor of the second flux concentrator 12_CF according to the direction Z.

Finally, the third magnetoresistive element 13_MR delivers in linear regime a third output voltage V13 such that:

$$V13 = \alpha_{13} a_{13x} B_x + \alpha_{13} a_{13y} B_y + \alpha_{13} a_{13z} B_z$$

where $a_{13}$ is the linear coefficient of the linear regime of the third magnetoresistive element, $a_{13x}$ is the amplification factor of the third flux concentrator 13_CF according to the direction X, $a_{13y}$ is the amplification factor of the third flux concentrator 13_CF according to the direction Y and $a_{13z}$ is the amplification factor of the third flux concentrator 13_CF according to the direction Z.

The three preceding equations can be written in matrix form:

$$\begin{bmatrix} V11 \\ V12 \\ V13 \end{bmatrix} = M' \begin{bmatrix} Bx \\ By \\ Bz \end{bmatrix}$$

with:

$$M = \begin{bmatrix} \alpha_{11} a_{11x} & \alpha_{11} a_{11y} & \alpha_{11} a_{11z} \\ \alpha_{12} a_{12x} & \alpha_{12} a_{12y} & \alpha_{12} a_{12z} \\ \alpha_{13} a_{13x} & \alpha_{13} a_{13y} & \alpha_{13} a_{13z} \end{bmatrix}$$

In the matrix M', the dominant coefficients are the diagonal terms, but the non-diagonal terms are not necessarily negligible.

By inverting the matrix M, it is therefore possible to return to the first, second and third components of the field from the voltage measurements:

$$\begin{bmatrix} Bx \\ By \\ Bz \end{bmatrix} = M^{-1} \begin{bmatrix} V11 \\ V12 \\ V13 \end{bmatrix}$$

As with the matrix M described hereinabove, the matrix M' is established during the manufacturing, by calibration of the first sensor 11, of the second sensor 12 and of the third sensor 13 submitted successively to a field according to X, to a field according to Y and to a field according to Z.

The invention claimed is:

1. A magnetic field sensor for detection of at least two magnetic field components comprising:
    a first sensor for the detection of a first magnetic component according to a first direction X comprising:
        a first flux concentrator comprising a first magnetic part, a second magnetic part and an air gap between the first and second magnetic parts;
        a first magnetoresistive element arranged in the air gap of the first flux concentrator,
    a second sensor for the detection of a second magnetic component according to a second direction Y that is different from the first direction X comprising:
        a second flux concentrator comprising a first magnetic part, a second magnetic part and an air gap between the first and second magnetic parts;
        a second magnetoresistive element arranged in the air gap of the second flux concentrator;
    each one of the first and second magnetoresistive elements comprising a reference layer having a fixed magnetisation direction and a sensitive layer having a variable magnetisation direction, with each of the first and second magnetoresistive elements having a first state of rest wherein the magnetisation of the sensitive layer has a given first direction, and a second excited state wherein the magnetisation of the sensitive layer has a second direction that is different from the first direction;
    wherein
    the fixed magnetisation direction of the reference layer of the first magnetoresistive element is substantially identical to the fixed magnetisation direction of the reference layer of the second magnetoresistive element;
    when the first and second magnetoresistive elements are in the first state of rest, the variable magnetisation direction of the sensitive layer of the first magnetoresistive element is substantially identical to the variable magnetisation direction of the sensitive layer of the second magnetoresistive element;
    the air gap of the first flux concentrator and the air gap of the second flux concentrator are oriented parallel to a direction XY which is, at ±15°, a bisector of the first direction X and of the second direction Y;
    the first magnetoresistive element comprises a first antiferromagnetic layer for the trapping of the fixed magnetisation direction of the reference layer of the first magnetoresistive element, the second magnetoresistive element comprises a second antiferromagnetic layer for the trapping of the fixed magnetisation direction of the reference layer of the second magnetoresistive element, and the first antiferromagnetic layer and the second antiferromagnetic layer have a same blocking temperature;
    each magnetic part of each flux concentrator has a first dimension and a second dimension less than the first dimension and each one of the first and second flux concentrators has a first dimension and a second dimension less than the first dimension, the second dimension of each flux concentrator being greater than or equal to the second dimension of each one of its magnetic parts, with the first flux concentrator and each magnetic part of the first flux concentrator having their first dimension according to the first direction X and their second dimension according to the second direction Y, with the second flux concentrator and each magnetic part of the second flux concentrator having their first dimension according to the second direction Y and their second dimension according to the first direction X.

2. The magnetic field sensor according to claim 1, wherein the second direction Y is substantially perpendicular to the first direction X.

3. The magnetic field sensor according to claim 1, wherein:
    the first sensor comprises a first permanent magnet and a second permanent magnet arranged on either side of the first magnetoresistive element, said first and second permanent magnets having a same magnetisation direction polarising the magnetisation of the sensitive layer of the first magnetoresistive element and determining the first magnetisation direction of said sensitive layer when the first magnetoresistive element is at rest, and
    the second sensor comprises a first permanent magnet and a second permanent magnet arranged on either side of the second magnetoresistive element, said first and second permanent magnets having a same magnetisation direction polarising the magnetisation of the sensitive layer of the second magnetoresistive element and determining the first magnetisation direction of said sensitive layer when the second magnetoresistive element is at rest,
    the magnetisation direction of the first and second permanent magnets of the first sensor being substantially identical to the magnetisation direction of the first and second permanent magnets of the second sensor.

4. The magnetic field sensor according to claim 1, wherein the first and second sensors have their magnetoresistive element constituted of the same materials.

5. The magnetic field sensor according to claim 1, wherein each magnetic part of each flux concentrator has a chamfered side.

6. The magnetic field sensor according to claim 5, wherein the chamfered side of each magnetic part of each flux concentrator is a bevelled side.

7. The magnetic field sensor according to claim 1, wherein each magnetic part of each flux concentrator has the chamfered side and a second chamfered side.

8. The magnetic field sensor according to claim 7, wherein the second chamfered side is a second bevelled side.

9. A magnetic field sensor for the detection of at least three magnetic field components comprising:
the magnetic field sensor for the detection of at least two magnetic field components according to claim 1, and
a third sensor for the detection of a third magnetic component according to a third direction Z that is different from the first direction X and from the second direction Y comprising:
a third flux concentrator comprising a first magnetic part, a second magnetic part and an air gap between the first and second magnetic parts;
a third magnetoresistive element arranged in the air gap of the third flux concentrator;
the third flux concentrator having a first dimension according to a direction substantially parallel to the third direction Z, and a second dimension according to a direction substantially parallel to the direction XY of the first and second sensors.

10. The magnetic field sensor for the detection of at least three magnetic field components according to claim 9, wherein the magnetoresistive elements of the first, second and third sensors are constituted of the same materials with directions of their reference layer and of their sensitive layer at rest that are substantially identical.

11. A method for manufacturing a magnetic field sensor for the detection of at least three magnetic field components comprising:
a magnetic field sensor for the detection of at least two magnetic field components comprising:
a first sensor for the detection of a first magnetic component according to a first direction X comprising:
a first flux concentrator comprising a first magnetic part, a second magnetic part and an air gap between the first and second magnetic parts;
a first magnetoresistive element arranged in the air gap of the first flux concentrator,
a second sensor for the detection of a second magnetic component according to a second direction Y that is different from the first direction X comprising:
a second flux concentrator comprising a first magnetic part, a second magnetic part and an air gap between the first and second magnetic parts;
a second magnetoresistive element arranged in the air gap of the second flux concentrator;
each one of the first and second magnetoresistive elements comprising a reference layer having a fixed magnetisation direction and a sensitive layer having a variable magnetisation direction, with each of the first and second magnetoresistive elements having a first state of rest wherein the magnetisation of the sensitive layer has a given first direction, and a second excited state wherein the magnetisation of the sensitive layer has a second direction that is different from the first direction;
wherein
the fixed magnetisation direction of the reference layer of the first magnetoresistive element is substantially identical to the fixed magnetisation direction of the reference layer of the second magnetoresistive element;
when the first and second magnetoresistive elements are in the first state of rest, the variable magnetisation direction of the sensitive layer of the first magnetoresistive element is substantially identical to the variable magnetisation direction of the sensitive layer of the second magnetoresistive element;
the air gap of the first flux concentrator and the air gap of the second flux concentrator are oriented parallel to a direction XY which is, at ±15°, a bisector of the first direction X and of the second direction Y;
the first magnetoresistive element comprises a first antiferromagnetic layer for the trapping of the fixed magnetisation direction of the reference layer of the first magnetoresistive element, the second magnetoresistive element comprises a second antiferromagnetic layer for the trapping of the fixed magnetisation direction of the reference layer of the second magnetoresistive element, and the first antiferromagnetic layer and the second antiferromagnetic layer have a same blocking temperature;
each magnetic part of each first and second flux concentrators has a first dimension and a second dimension less than the first dimension and each one of the first and second flux concentrators has a first dimension and a second dimension less than the first dimension, the second dimension of each first and second flux concentrators being greater than or equal to the second dimension of each one of its magnetic parts, with the first flux concentrator and each magnetic part of the first flux concentrator having their first dimension according to the first direction X and their second dimension according to the second direction Y, with the second flux concentrator and each magnetic part of the second flux concentrator having their first dimension according to the second direction Y and their second dimension according to the first direction X, and
a third sensor for the detection of a third magnetic component according to a third direction Z that is different from the first direction X and from the second direction Y comprising:
a third flux concentrator comprising a first magnetic part, a second magnetic part and an air gap between the first and second magnetic parts;
a third magnetoresistive element arranged in the air gap of the third flux concentrator;
the third flux concentrator having a first dimension according to a direction substantially parallel to the third direction Z, and a second dimension according to a direction substantially parallel to the direction XY of the first and second sensors,
the method comprising:
providing the first sensor on a face of a first region of a substrate, providing the second sensor on a face of a second region of the substrate and providing the third sensor on a face of a third region of the substrate, said substrate extending according to a reference plane OXY, the first direction X and the second direction Y being parallel to the reference plane OXY;

separating a first portion of the third region of the substrate from a rest of the substrate, the first portion comprising the face whereon the third sensor is provided and the first portion protruding from the reference plane OXY.

12. The method for manufacturing according to claim 11, wherein the first portion of the third region of the substrate that protrudes from the reference plane OXY extends substantially according to a plane perpendicular to the reference Plane OXY.

13. The method for manufacturing according to claim 11, wherein the first portion of the third region of the substrate is separated from the rest of the substrate by etching a second portion and a third portion of the third region of the substrate.

14. A method for writing a magnetisation direction of reference layers in a magnetic field sensor for detection of at least two magnetic field components comprising:
- a first sensor for the detection of a first magnetic component according to a first direction X comprising:
  - a first flux concentrator comprising a first magnetic part, a second magnetic part and an air gap between the first and second magnetic parts;
  - a first magnetoresistive element arranged in the air gap of the first flux concentrator,
- a second sensor for the detection of a second magnetic component according to a second direction Y that is different from the first direction X comprising:
  - a second flux concentrator comprising a first magnetic part, a second magnetic part and an air gap between the first and second magnetic parts;
  - a second magnetoresistive element arranged in the air gap of the second flux concentrator;
- each one of the first and second magnetoresistive elements comprising a reference layer having a fixed magnetisation direction and a sensitive layer having a variable magnetisation direction, with each of the first and second magnetoresistive elements having a first state of rest wherein the magnetisation of the sensitive layer has a given first direction, and a second excited state wherein the magnetisation of the sensitive layer has a second direction that is different from the first direction;

wherein the fixed magnetisation direction of the reference layer of the first magnetoresistive element is substantially identical to the fixed magnetisation direction of the reference layer of the second magnetoresistive element;

when the first and second magnetoresistive elements are in the first state of rest, the variable magnetisation direction of the sensitive layer of the first magnetoresistive element is substantially identical to the variable magnetisation direction of the sensitive layer of the second magnetoresistive element;

the air gap of the first flux concentrator and the air gap of the second flux concentrator are oriented parallel to a direction XY which is, at ±15°, a bisector of the first direction X and of the second direction Y;

the first magnetoresistive element comprises a first antiferromagnetic layer for the trapping of the fixed magnetisation direction of the reference layer of the first magnetoresistive element, the second magnetoresistive element comprises a second antiferromagnetic layer for the trapping of the fixed magnetisation direction of the reference layer of the second magnetoresistive element, and the first antiferromagnetic layer and the second antiferromagnetic layer have a same blocking temperature;

each magnetic part of each flux concentrator has a first dimension and a second dimension less than the first dimension and each one of the first and second flux concentrators has a first dimension and a second dimension less than the first dimension, the second dimension of each flux concentrator being greater than or equal to the second dimension of each one of its magnetic parts, with the first flux concentrator and each magnetic part of the first flux concentrator having their first dimension according to the first direction X and their second dimension according to the second direction Y, with the second flux concentrator and each magnetic part of the second flux concentrator having their first dimension according to the second direction Y and their second dimension according to the first direction X, wherein the fixed magnetisation direction of the reference layer of each magnetoresistive element is trapped by an antiferromagnetic layer, each antiferromagnetic trapping layer having the same blocking temperature, with the method comprising:

simultaneous heating the antiferromagnetic trapping layers to a temperature greater than the blocking temperature;

when the antiferromagnetic trapping layers have a temperature greater than the blocking temperature, simultaneously applying to the antiferromagnetic trapping layers a write field oriented according to a desired direction for the magnetisation of the reference layers;

stopping the heating while still maintaining the application of the write field to the antiferromagnetic trapping layers;

when the antiferromagnetic trapping layers have dropped to a temperature less than the blocking temperature, stopping the application of the write field.

* * * * *